(12) United States Patent
Shimizu et al.

(10) Patent No.: US 7,898,015 B2
(45) Date of Patent: Mar. 1, 2011

(54) INSULATING FILM AND SEMICONDUCTOR DEVICE USING THIS FILM

(75) Inventors: Tatsuo Shimizu, Tokyo (JP); Masato Koyama, Miura-gun (JP)

(73) Assignee: Kabushiki Kaisha Toshiba, Toyko (JP)

( * ) Notice: Subject to any disclaimer, the term of this patent is extended or adjusted under 35 U.S.C. 154(b) by 669 days.

(21) Appl. No.: 11/689,301

(22) Filed: Mar. 21, 2007

(65) Prior Publication Data

US 2008/0067636 A1    Mar. 20, 2008

(30) Foreign Application Priority Data

Sep. 14, 2006 (JP) .................. 2006-250074

(51) Int. Cl.
*H01L 29/94* (2006.01)
(52) U.S. Cl. ................. 257/310; 257/288; 257/E21.639; 257/E21.625; 438/216
(58) Field of Classification Search .................. 257/59, 257/410, E51.006, E51.007, E27.06; 438/299; 365/100
See application file for complete search history.

(56) References Cited

U.S. PATENT DOCUMENTS

| 2002/0072180 A1* | 6/2002 | Yugami et al. | 438/299 |
| 2003/0235064 A1* | 12/2003 | Batra et al. | 365/100 |
| 2004/0084736 A1* | 5/2004 | Harada | 257/410 |
| 2005/0029230 A1* | 2/2005 | Fujii | 216/83 |
| 2005/0274948 A1* | 12/2005 | Tamura et al. | 257/59 |

FOREIGN PATENT DOCUMENTS

JP     2002-299614     10/2002

OTHER PUBLICATIONS

U.S. Appl. No. 12/358,466, filed Jan. 23, 2009, Shimizu, et al.

* cited by examiner

*Primary Examiner* — Matthew E Warren
*Assistant Examiner* — Fang-Xing Jiang
(74) *Attorney, Agent, or Firm* — Oblon, Spivak, McClelland, Maier & Neustadt, L.L.P.

(57) ABSTRACT

An insulating film includes a first metal, oxygen, fluorine and one of a second metal or nitrogen, and satisfies $\{k \times [X] - [F]\}/2 \leq 8.4$ atomic %, wherein the fluorine amount [F], the one element amount [X], and a valence number difference k between the first and second metals or between oxygen and nitrogen.

10 Claims, 12 Drawing Sheets

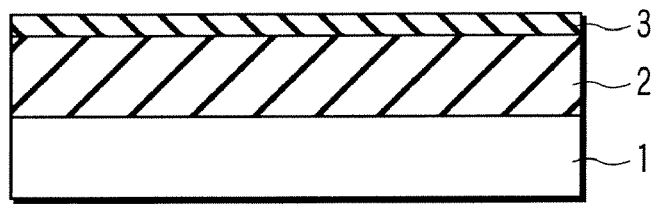
F I G. 7A
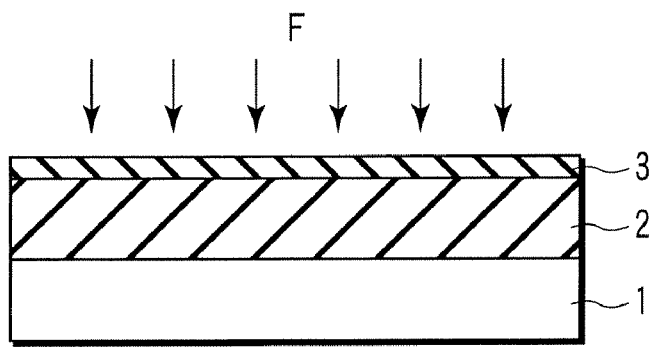
F I G. 7B
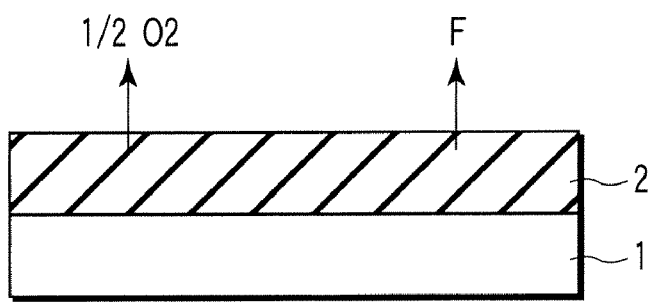
F I G. 7C
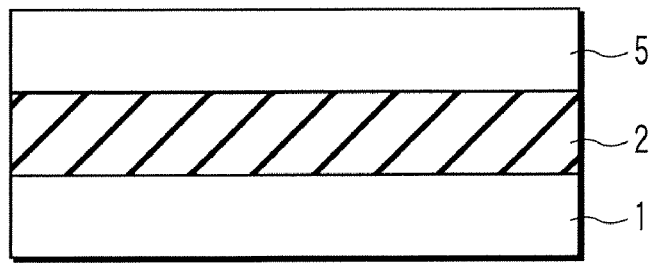
F I G. 7D

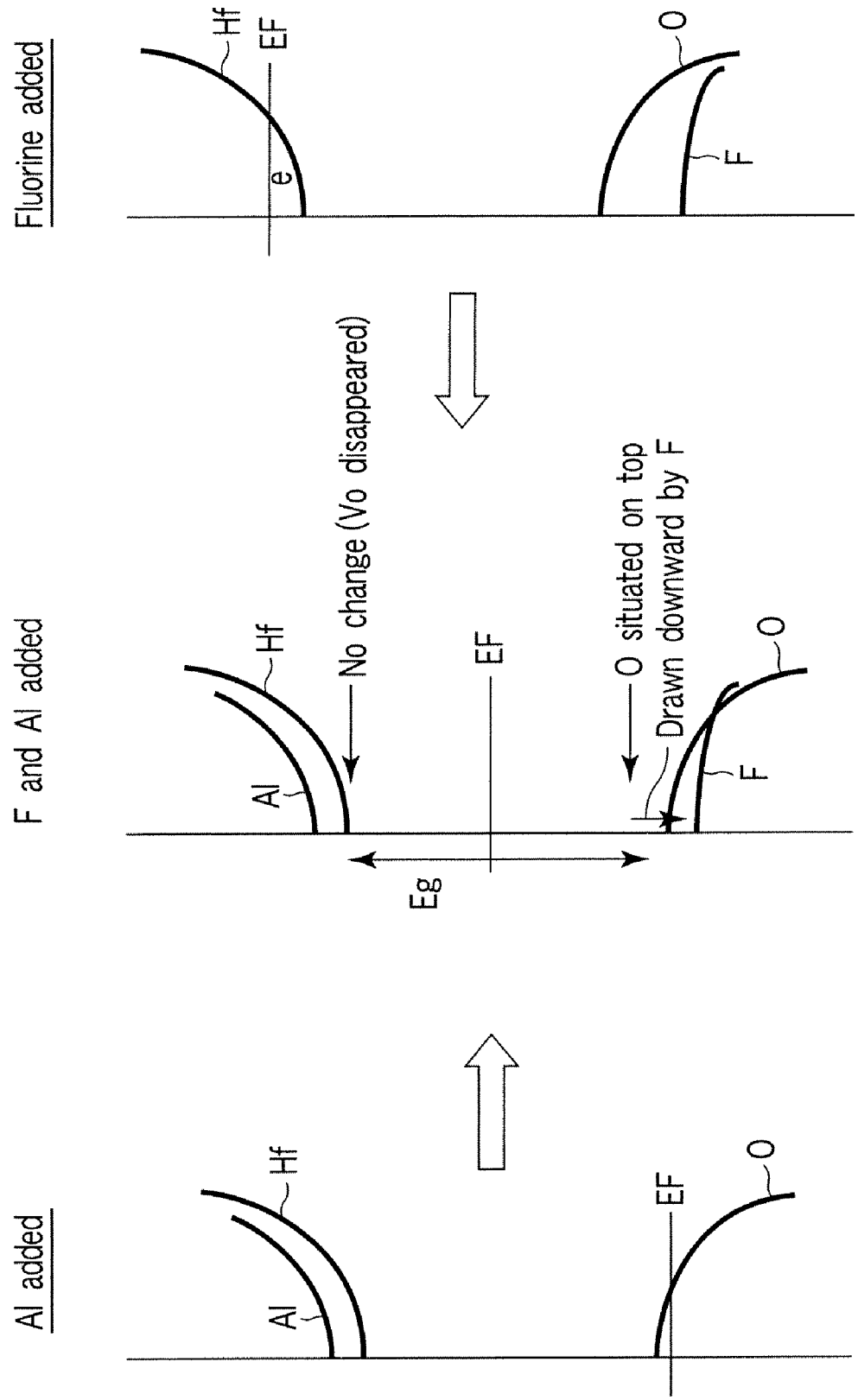

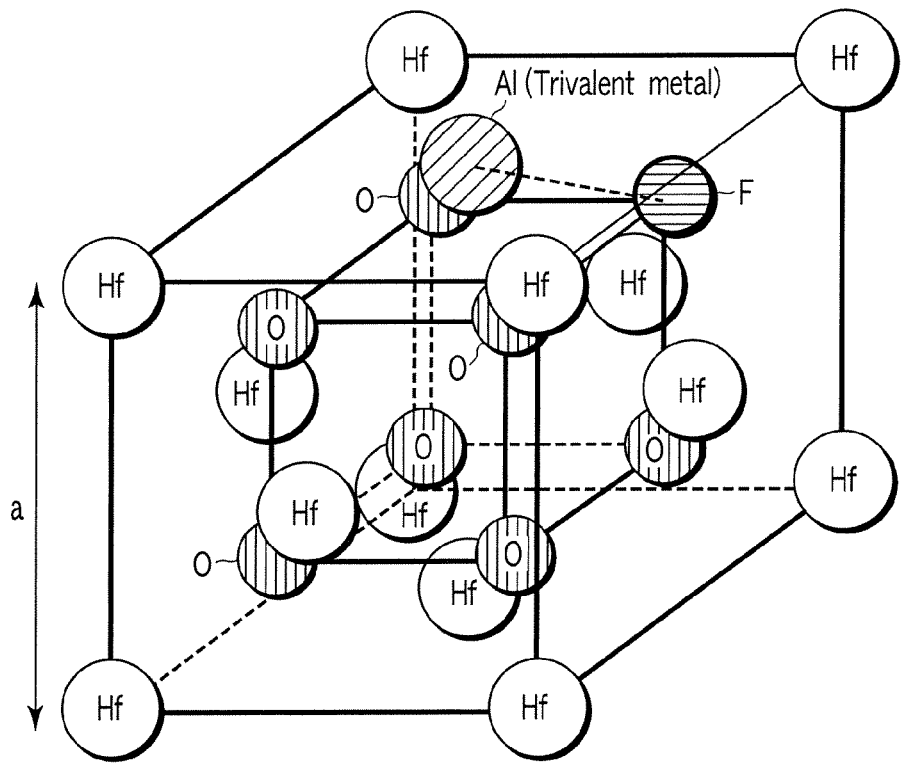
F I G. 11A
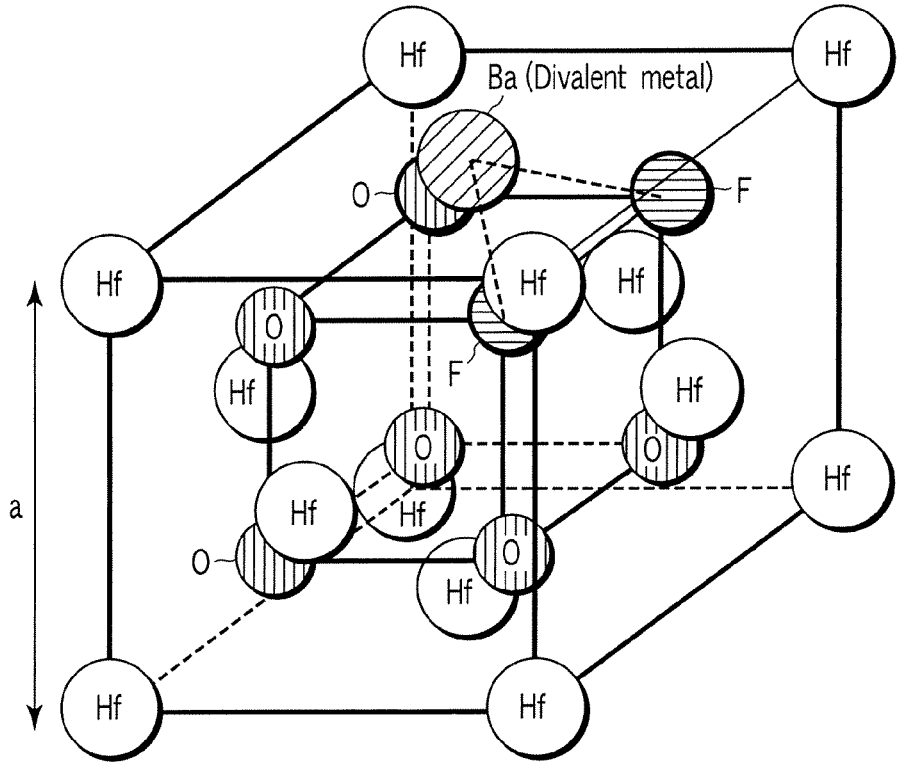
F I G. 11B

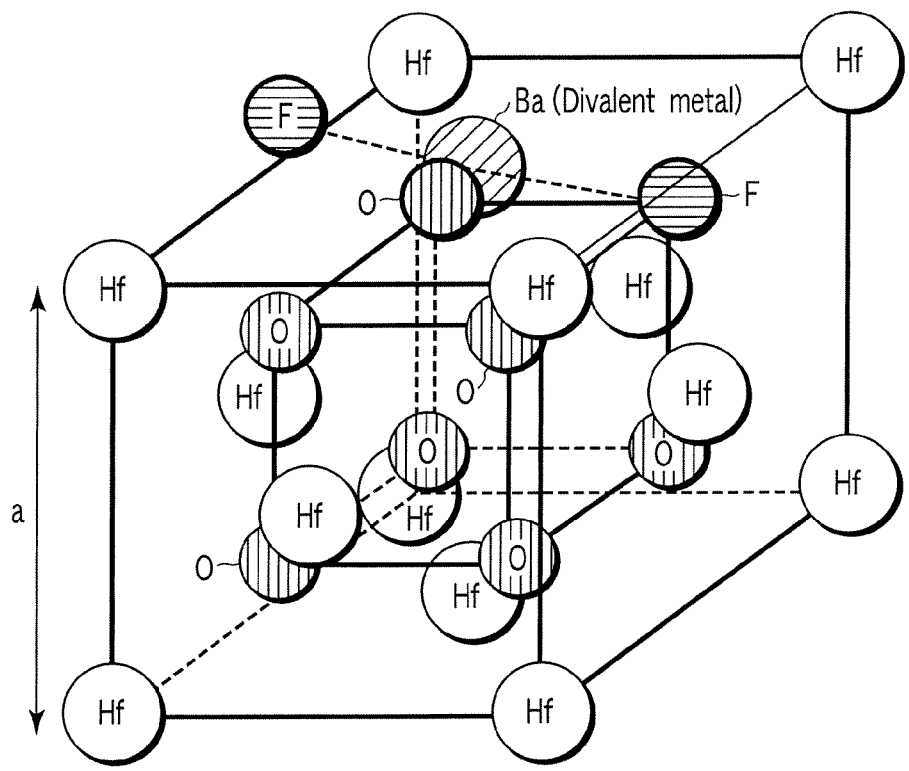
F I G. 12A
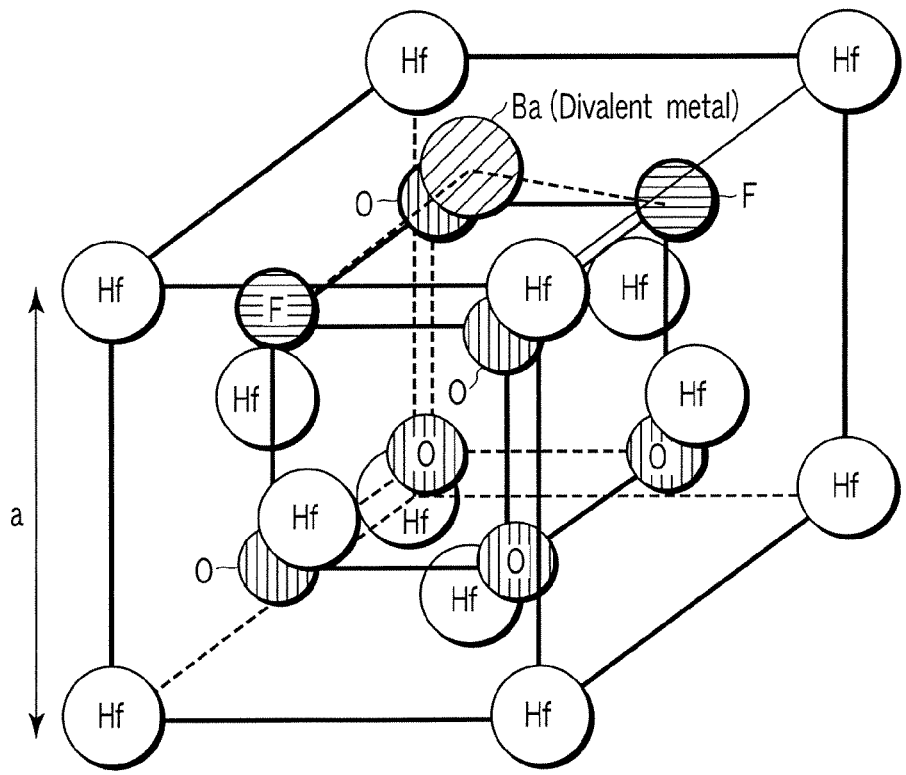
F I G. 12B

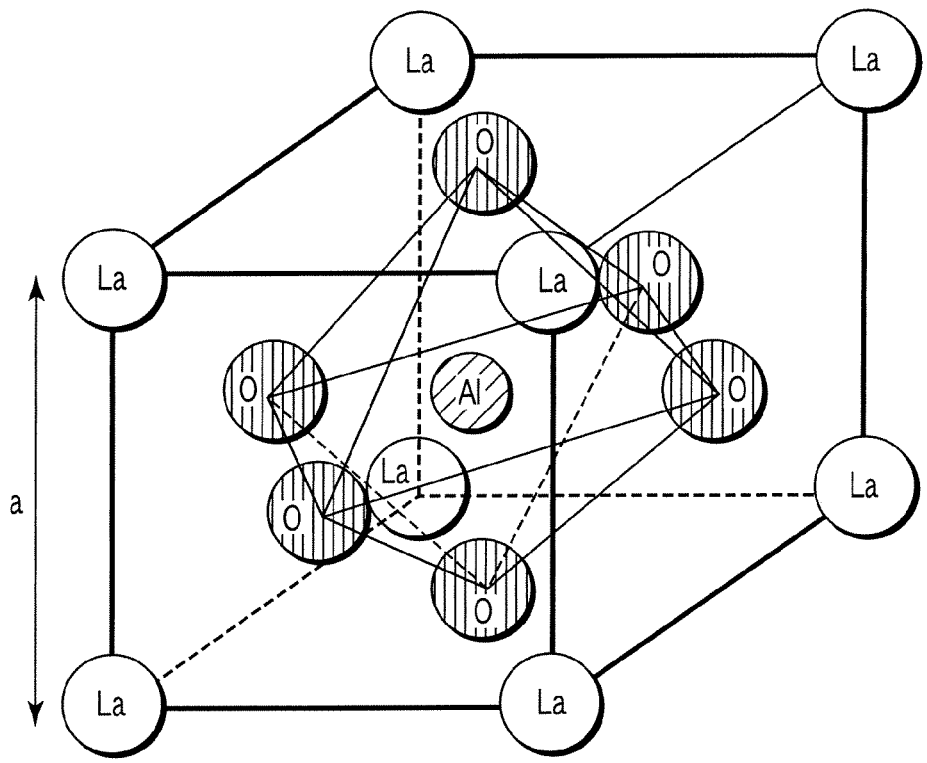
F I G. 13A
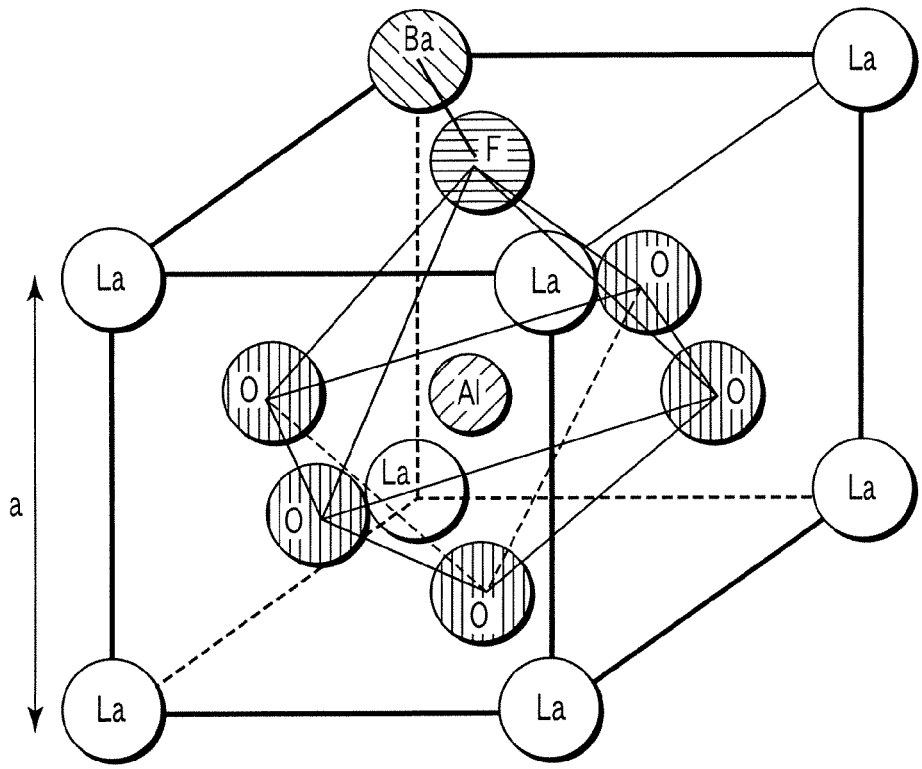
F I G. 13B

INSULATING FILM AND SEMICONDUCTOR DEVICE USING THIS FILM

CROSS-REFERENCE TO RELATED APPLICATIONS

This application is based upon and claims the benefit of priority from prior Japanese Patent Application No. 2006-250074, filed Sep. 14, 2006, the entire contents of which are incorporated herein by reference.

BACKGROUND OF THE INVENTION

1. Field of the Invention

The present invention relates to a metal oxide insulating film containing fluorine and a metal, and a semiconductor device using this film.

2. Description of the Related Art

In order to assure an electric charge amount induced in a channel of an MISFET (a metal insulator semiconductor field effect transistor), a technique of reducing a film thickness of a gate insulating film to increase a capacitance has been conventionally adopted. As a result, a reduction in film thickness of a $SiO_2$ film as a gate insulating film has been propelled, and a film thickness is currently about to reach a value that is far smaller than 1 nm. However, in the $SiO_2$ film, a gate leakage current is increased, and power consumption cannot be suppressed because of dissipation of a standby energy For example, in a $SiO_2$ film having a film thickness of 0.8 nm, a gate leakage current has reached 1 $kA/cm^2$, thus the problem regarding power consumption is very serious.

Increasing a film thickness is effective for a reduction in power consumption. Therefore, there has been examined an insulating film that can assure an amount of electric charge by using a high-K dielectric material even though this film is thicker than a $SiO_2$ film. As stable high-K dielectric materials, many metal oxides are known.

As insulating films having such characteristics, especially insulating films that are currently prospective, there are $HfO_2$, $ZrO_2$, silicate films using these materials (HfSiO, ZrSiO), $LaAlO_3$ and others.

However, a high-K dielectric metal oxide is apt to contain an oxygen vacancy, and this oxygen vacancy freely moves. As a result, the following problems occur.

(1) The oxygen vacancy that moves freely serves as a trigger, precipitation of a crystal thereby readily occurs from an amorphous structure, and hence uniformity of insulating film characteristics cannot be guaranteed (a problem of phase separation and crystallization).

(2) A vacancy level due to the oxygen vacancy occurs in a band gap, and this becomes a source of a leakage current (a problem of leakage through the oxygen vacancy).

(3) A structural defect occurs with movement of the oxygen vacancy, and long-term reliability is deteriorated (a problem of reliability).

(4) When an electron is shifted from the oxygen vacancy, the energy is stabilized, and a large shift of a threshold voltage (Vth) occurs. A Fermi level of an electrode is fixed, Vth of a PMOS is increased by approximately 0.6 eV to be pinned (a Vth pinning problem in a PMOS).

These problems are problems relating to all insulating films, not just MISFETs. The problems related to the characteristics of an insulating film are of critical importance with regards to insulating films used in a metal-insulator-metal (MIM) capacitor sandwiched between metal electrodes, or a flash memory cell or a part of its laminated structure.

Meanwhile, a first gate insulating film, which is considered to be most important in the current situation, is a nitride (HfON, ZrON, HfSiON, or ZrSiON). However, introduction of nitrogen has the following many problems.

(1) Nitrogen is small in capability of pinning an oxygen vacancy, and a large amount of nitrogen must be introduced to suppress crystallization.

(2) A reduction in a band gap due to nitrogen is considerable. When a large amount of nitrogen is introduced, a band offset $\Delta Ec$ with respect to a Si substrate on a conduction band side is reduced by nearly 0.5 to 1.0 eV. A band offset $\Delta Ev$ with respect to a Si substrate of a valence band is also decreased by approximately 1.0 eV. A leakage current is considerably deteriorated as compared with an essential merit.

(3) A problem also occurs in long-term reliability due to nitrogen. With the introduction of nitrogen, the oxygen vacancy is also increased. However, as the oxygen vacancy cannot be sufficiently fixed, a structure is changed with movement of the oxygen vacancy over a long period of time. Further, when the structure changes, fixed charges or fixed polarization occurs, thus considerably deteriorating dielectric characteristics.

(4) A complex of nitrogen and an oxygen vacancy Vo (which will be referred to as "NVoN" hereinafter) goes readily to pieces. At this time, the fixed charges enter a dispersed state, and this becomes a factor of reduced mobility of a carrier traveling through a channel.

(5) When excessive introduction of nitrogen is present, negative charges are produced. That is because nitrogen excessively takes in electrons. Furthermore, the oxygen vacancy is apt to occur near nitrogen, depending on the process, and the oxygen vacancy Vo is charged to become positive. In this manner, electric charges caused due to introduction of nitrogen have a possibility of greatly fluctuating Vth. Moreover, since the fixed charges become scattered bodies, this provokes serious deterioration in mobility. When nitrogen is additionally introduced based on thermal diffusion after forming an HfSiON film, the oxygen vacancy Vo is produced. As a result, an insulating film having an increased internal positive electric charge amount is generated, thus deteriorating mobility. Although electric charges are compensated, the number of scattered bodies themselves is increased.

The second gate insulating film that appears promising is an aluminate thin film (e.g., HfAlO). Since Al has a very small ion radius, phase separation readily occurs. Since many oxygen vacancies are introduced when Al is adopted, it is known that phase separation is apt to occur through movable oxygen vacancies. In order to maintain an amorphous structure, a large amount of Al must be adopted. In this case, however, the lowest part of a conduction band is greatly affected, and a considerable reduction in $\Delta Ec$ also occurs.

In regard to an improvement in reliability, a method of introducing F is proposed (see, e.g., JP-A 2002-299614). It is known that F terminates, e.g., a dangling bond of an interface of a substrate and an insulating film, and prevents reliability-deteriorating mechanisms, such as negative bias temperature instability of the interface (NBTI) or the like, from occurring, thereby improving reliability.

However, when fluorine is simply introduced into a film, fixed charges are produced, and a shift of Vth occurs, thereby making it difficult to control. This leads to a source of serious deterioration in mobility because of the fixed charges. Therefore, a method or a structure that increases an amount of fluorine near an interface required to improve reliability and prevents fluorine from being introduced into a film has been vigorously examined.

Further, when fluorine is present near an interface of a substrate and an insulating film, NBTI reliability is improved. Fluorine in the film does not have any effect on NBTI, and becomes a charge center (the fixed charge) as aforementioned. Therefore, fluorine is not introduced into the film. On the other hand, when nitrogen is present near an interface of an insulating film and an electrode film, it demonstrates an effect of preventing boron from coming through the interface. When nitrogen is present near an interface of a substrate and an insulating film, it provokes occurrence of fixed charges or distortion of an interface structure, and hence a structure in which nitrogen is apart from the interface of the substrate and the insulating film is good.

An oxide insulating film formed of, e.g., HfO2 involves a problem of precipitation of micro-crystals in a heating step in manufacture of a semiconductor device. Although introduction of nitrogen or Al is attempted to overcome this problem, the essential merit of this film is largely offset by the very high leakage current. It is therefore necessary to provide an insulating film that fixes or eliminates a movable oxygen vacancy, produces no micro-crystal precipitation and no reduction in a band, and avoids a band gap state.

BRIEF SUMMARY OF THE INVENTION

According to one aspect of the invention, there is provided a semiconductor device, which includes:
a first metal element as a core metal;
oxygen;
fluorine; and
one element which is either a second metal element or nitrogen,
wherein amount of the fluorine is expressed as [F], amount of the one element is expressed as [X], and a valence number difference between the first metal element and the second metal element or between oxygen and nitrogen is expressed as k, a following relationship:

$$\{k \times [X] - [F]\}/2 \leq 8.4 \text{ atomic \%}$$

is satisfied, and
if the one element is the second metal element, the first metal element is a quadrivalent metal element, and the second metal element is a trivalent metal element, amount of which is expressed as [trivalent element], then [X]=[trivalent element] and k=1,
if the one element is the second metal element, the first metal element is a quadrivalent metal element, and the second metal element is a divalent metal element, amount of which is expressed as [divalent element], then [X]=[divalent element] and k=2,
if the one element is the second metal element, the first metal element is a trivalent metal element, and the second metal element is a divalent metal element, amount of which is expressed as [divalent element], then [X]=[divalent element] and k=1, and
if the one element is nitrogen, amount of which is expressed as [N], then [X]=[N] and k=1.

BRIEF DESCRIPTION OF THE SEVERAL VIEWS OF THE DRAWING

FIGS. 2A to 2C are schematic views for explaining an effect when an additive is added to the high-K dielectric film, in which FIG. 2A is a view explaining an example where nitrogen N is added, FIG. 2C is a view showing an example where fluorine F is added, and FIG. 2B is a view for explaining the combined effect when these materials are used;

FIGS. 5A and 5B are block diagrams when nitrogen N is introduced and an oxygen vacancy Vo is present, in which FIG. 5A shows an "NVoN" structure, and FIG. 5B shows an "NVo+N" structure;

FIGS. 7A to 7D are cross-sectional views of an insulating film structure, stepwise showing an insulating film forming method according to the embodiment;

FIGS. 10A to 10C are schematic views for explaining an effect when an additive is added to a high-K dielectric film, in which FIG. 10A is a schematic view showing an example where aluminum Al is added, FIG. 10C is a schematic view showing an example where fluorine F is added, and FIG. 10B is a schematic view for explaining the combined effect when these materials are used;

FIG. 11A is a block diagram showing an Al (a trivalent metal)-F pair introduced into $HfO_2$;

FIG. 11B is a block diagram showing F—Ba (a divalent metal)-F coupling introduced into $HfO_2$;

FIG. 12A is another block diagram showing F—Ba (the divalent metal)-F coupling introduced into $HfO_2$;

FIG. 12B is a further block diagram showing F—Ba (the divalent metal)-F coupling introduced into $HfO_2$;

FIG. 13A shows a crystal structure as an $LaAlO_3$ perovskite structure;

FIG. 13B is a block diagram when Ba—F is introduced into the perovskite structure depicted in FIG. 13A;

DETAILED DESCRIPTION OF THE INVENTION

Figure 1:
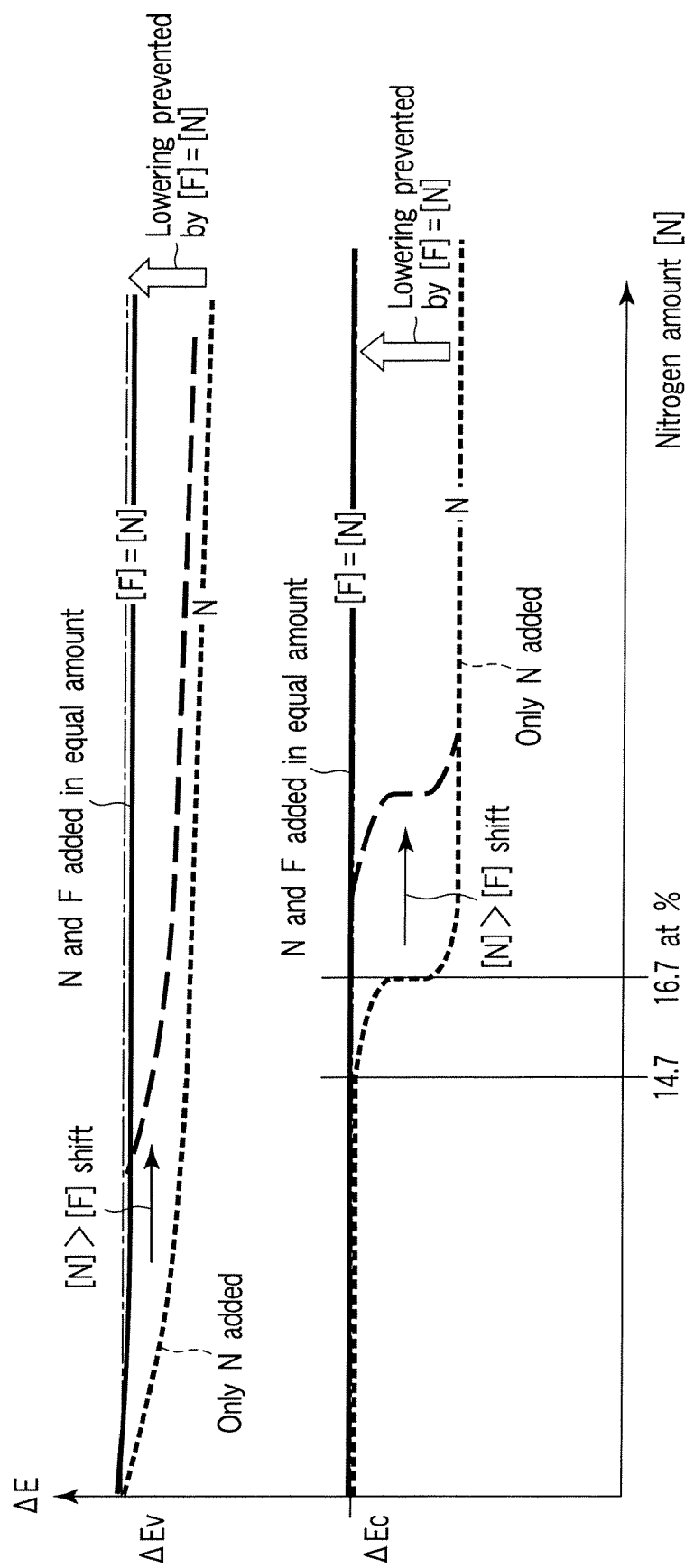
FIG. 1 is a schematic view showing a relationship between a nitrogen amount [N] added to a high-K dielectric film and a band offset ($\Delta E$) with respect to a silicon substrate.

The present inventors have studied a method of completely eliminating an oxygen vacancy of a metal oxide having a high-K dielectric in a development process of the present invention. As a result, the present inventors have obtained the following knowledge.

As current typical film forming methods, a chemical vapor deposition (CVD) method, an atomic layer deposition (ALD) method, a molecular beam epitaxy (MBE) method, a sputtering method, and others are considered. Even if any of these methods is used, when nitrogen is introduced, many oxygen vacancies are produced in accordance with a nitrogen amount. Although the oxygen vacancy fixing power of nitrogen is small, introducing a considerable amount of nitrogen can maintain an insulating film in an amorphous state through a heating step in manufacture. However, a barrier $\Delta Ev$ of a valence band with respect to a Si substrate is precipitously deteriorated (0.5 eV to 1.5 eV) because of introduction of nitrogen, and a barrier ΔEc of a conduction band with respect to the Si substrate is also greatly deteriorated (0.5 to 1.0 eV). It is considered that a leakage is amazingly increased as compared with an essential merit of the film.

When Al is introduced, $Al_2O_3$ is stable in terms of energy, and an Al ion radius is very smaller than that of Hf or Zr. For these reasons, precipitation readily occurs. Further, when a large amount of Al is introduced, various impurity levels are produced in a band gap, and deterioration in insulating film characteristics is prominent.

Unfortunately, to date, there is no known additive that removes oxygen vacancies from a metal oxide, produces no bandgap narrowing and no level in the gap.

An embodiment according to the present invention will now be explained hereinafter with reference to the accompanying drawings. It is to be noted that like reference numerals denote constituent elements having substantially the same functions and structures in the following explanation, and a tautological explanation will be given as required.

An insulating film according to the present invention is mainly an oxide insulating film of a quadrivalent metal (Hf, Zr, or Ti) or a trivalent metal (La or Al), and also an oxide insulating film to which a material having a valence lower than that of such a constituent metal or nitrogen is added. An appropriate amount of F is simultaneously introduced in accordance with an added amount of a low-valence material or nitrogen.

(Structure)

A first conformation of the present invention is an insulating film characterized in that nitrogen (N) and fluorine (F) are simultaneously introduced into a high-K dielectric thin film of a metal oxide, e.g., $HfO_2$, $ZrO_2$, $HfSiO_4$, $ZrSiO_4$, $LaAlO_3$, $La_2O_3$, or $Al_2O_3$.

FIG. 1 is a schematic view for explaining an effect when nitrogen is added (HfON), and the abscissa represents the amount of nitrogen [N] whilst the ordinate represents the amount of offset ΔE on an energy band with respect to a silicon substrate. ΔEv is an offset of a valence band. When nitrogen alone is added, as indicated by a dotted line, the offset amount is reduced as the nitrogen amount is increased, and it is reduced by approximately 0.5 to 1.5 eV as explained above. On the other hand, when equal amounts of nitrogen [N] and fluorine [F] are added, a reduction in the offset amount can be avoided. When [N]>[F], a point at which the offset amount starts to fall shifts in a direction along which [N] is increased.

ΔEc is an offset of a conduction band. In a case where nitrogen alone is added, as indicated by a dotted line, the offset is suddenly reduced when the [N] amount exceeds 16.7% (the basis of 16.7% will be explained later), and the offset is reduced by approximately 0.5 to 1.0 eV, as explained above. On the other hand, when equal amounts of nitrogen [N] and fluorine [F] are added, a reduction in the offset amount can be avoided. When [N]>[F], a point at which the offset amount starts to fall shifts in a direction along which the [N] amount is increased.

Figure 2:
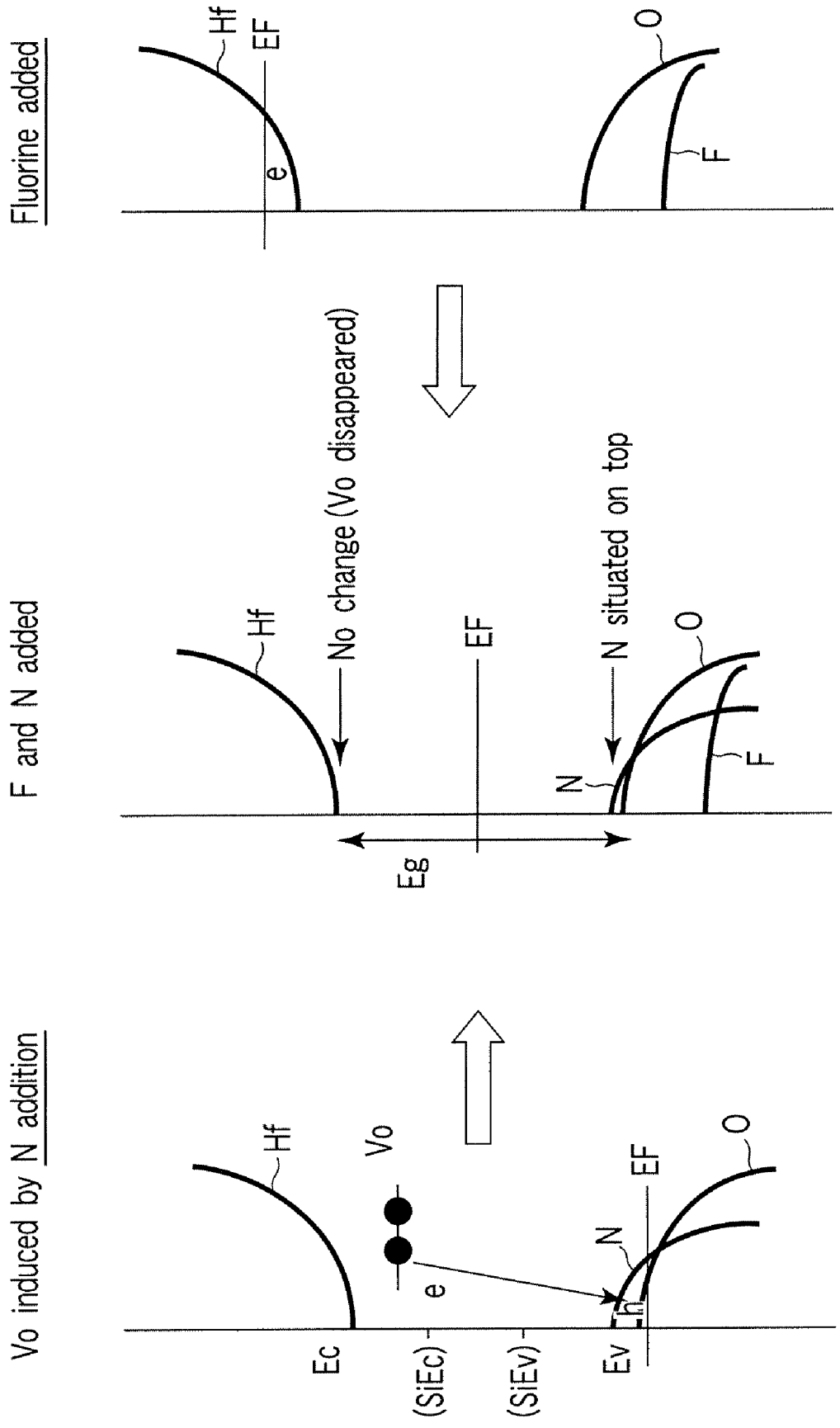

A mechanism demonstrating the above-described characteristics will now be explained. FIGS. 2A to 2C are views partially showing a lower part of the conduction band to an upper part of the valence band of a density of state (DOS) of HfON. When oxygen O in $HfO_2$ is substituted by nitrogen N, the number of electrons is insufficient, and an electron hole (a hole h) is formed near the top of the valence band (VB), as shown in FIG. 2A. At this time, an oxygen vacancy Vo occurs. When an excess of electrons e is present near the oxygen vacancy, these electrons e close the electron hole h near the top of the VB, thereby reducing the overall amount of energy. This is the mechanism of generation of oxygen vacancies involved due to introduction of nitrogen, as seen from a micro-electronic point of view. It is to be noted that EF denotes a Fermi level.

At this time, as indicated by a dotted line in FIG. 1, there are serious problems regarding the electrical state of the insulating film. The first problem is a reduction in the band offset ΔEv with respect to Si, which is due to an increase of the top of the VB. A second problem is lowering of the lowest part of the conduction band (CB) due to interaction of oxygen vacancies when a large amount of nitrogen is introduced, thus reducing the band offset ΔEc with respect to Si.

Here, the electronic state, system energy, atomic arrangement, and others are obtained by a first principles calculation using an ultra-soft pseudo-potential. This is a method based on a density functional method, and it is a calculation based on a local density approximation. Potentials used in this calculation, e.g., Hf, O, N, F, Ba, Sr, Ca, Mg, Al, La, Y and others have been already utilized in various forms, and have high reliability. For example, a lattice constant of $HfO_2$ obtained by a calculation (a0=9.55 Bohr=5.052 A) is smaller than an experimental value (9.603 Bohr=5.08 A) by just 0.55%, and hence it can be said this value is sufficient. In this embodiment, the calculation is performed based on the $HfO_2$ structure. For example, when using a 96-atom unit cell having a size of 2a×2a×2a with respect to a lattice constant a, the number of k points used in a calculation of a Brillouin zone (BZ) is eight, and an energy cutoff is 30.25 Ryd (1 Ryd=13.6058 eV).

As shown in FIG. 2C, when fluorine F substitutes for oxygen O, one electron remains, and this electron is supplemented near the CB bottom. Here, important characteristics can be observed in the electronic state. In both a state of the CB and a state of the top of the VB, a change is rarely observed even if fluorine F substitutes for oxygen O. Therefore, as indicated by a solid line in FIG. 1, introducing fluorine can completely avoid a reduction in each of ΔEc and ΔEv. When the amount of fluorine is insufficient, it is good enough to have an image that a dotted line representing a state of nitrogen in FIG. 1 shifts toward a right-hand side by considering that surplus nitrogen is present (a shift from the dotted line to a broken line).

As shown in FIG. 2A, in the introduction of nitrogen, an oxygen vacancy Vo is produced to stabilize the entire system. Likewise, the hole h at the top of the VB formed by substitution of nitrogen is filled with the electron e (FIG. 2C) at the bottom of the CB produced by substitution of fluorine, thereby stabilizing the entire system. FIG. 2B shows the final electronic state. A reduction in each of ΔEc and ΔEv is rarely recognized. In particular, it is understood that an increase in VB top due to nitrogen settles in such a manner that an electronic state of fluorine pulls the increase downward, thereby avoiding a reduction in ΔEv.

Figure 3:
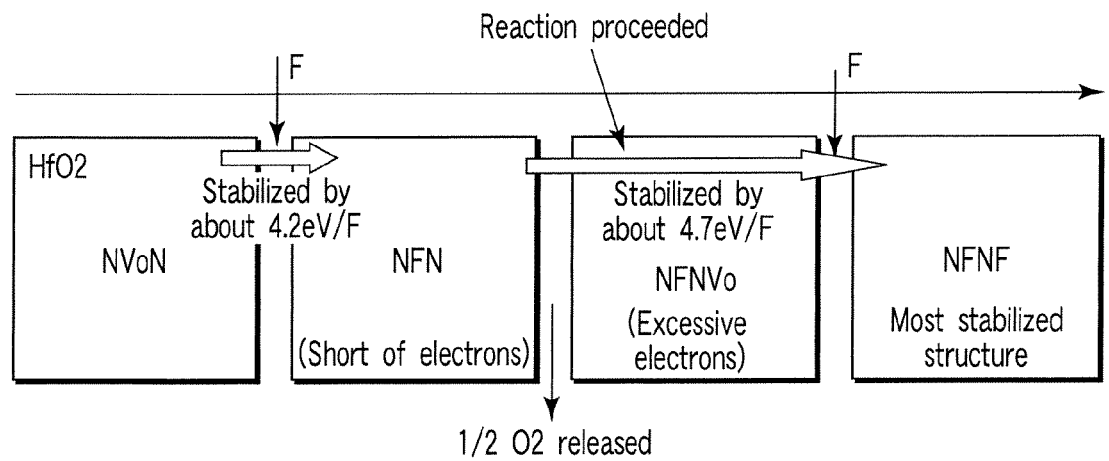
FIG. 3 is a schematic view for explaining a process in which an oxygen vacancy disappears based on an embodiment.

FIG. 3 schematically shows how fluorine is taken into HfON. When nitrogen is introduced into $HfO_2$, the oxygen vacancy Vo is produced at a ratio of nitrogen:oxygen vacancy=2:1, thus stabilizing the entire system.

Figure 4:
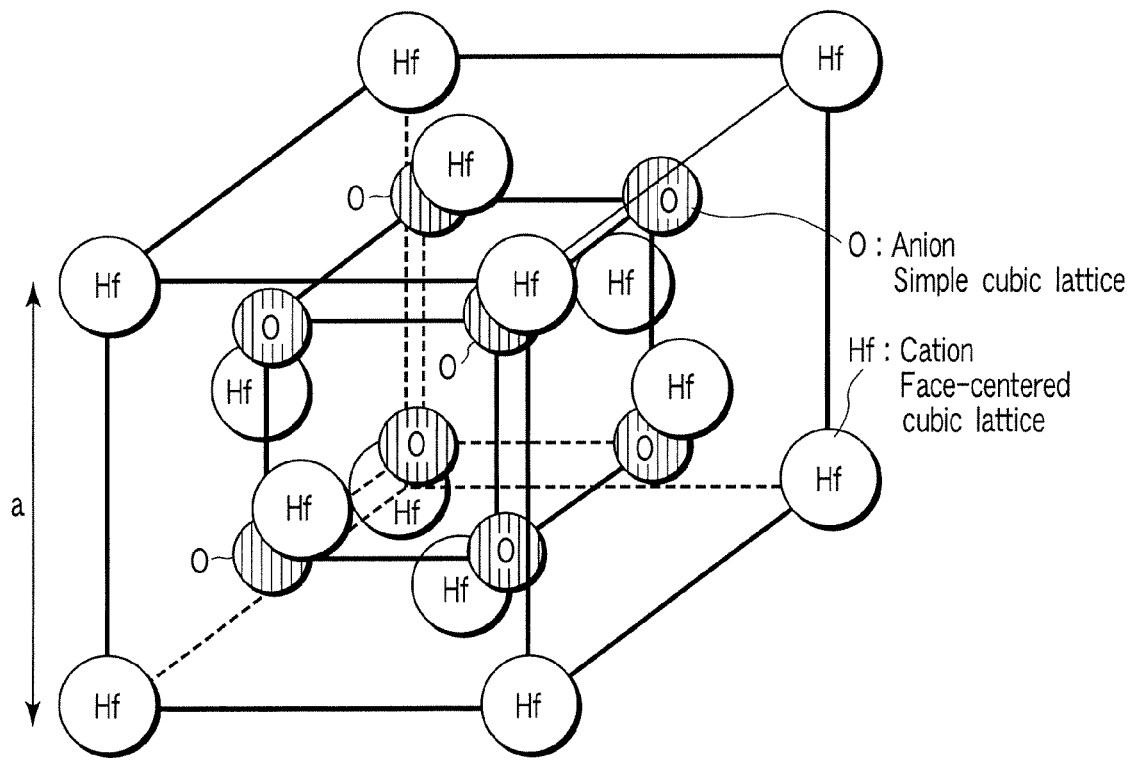
FIG. 4 is a schematic view showing a general lattice structure of $HfO_2$.

Meanwhile, as shown in FIG. 4, in regard to a basic structure of $HfO_2$, Hf forms a face-centered cubic lattice (FCC), and O forms a simple cubic lattice (SC) therein. This is a so-called calcium fluoride structure. The oxygen vacancy Vo, nitrogen N, and fluorine F substitute for oxygen (anion) positions, and Al, Ba, and others substitute for Hf (cation) positions.

Figure 5A:
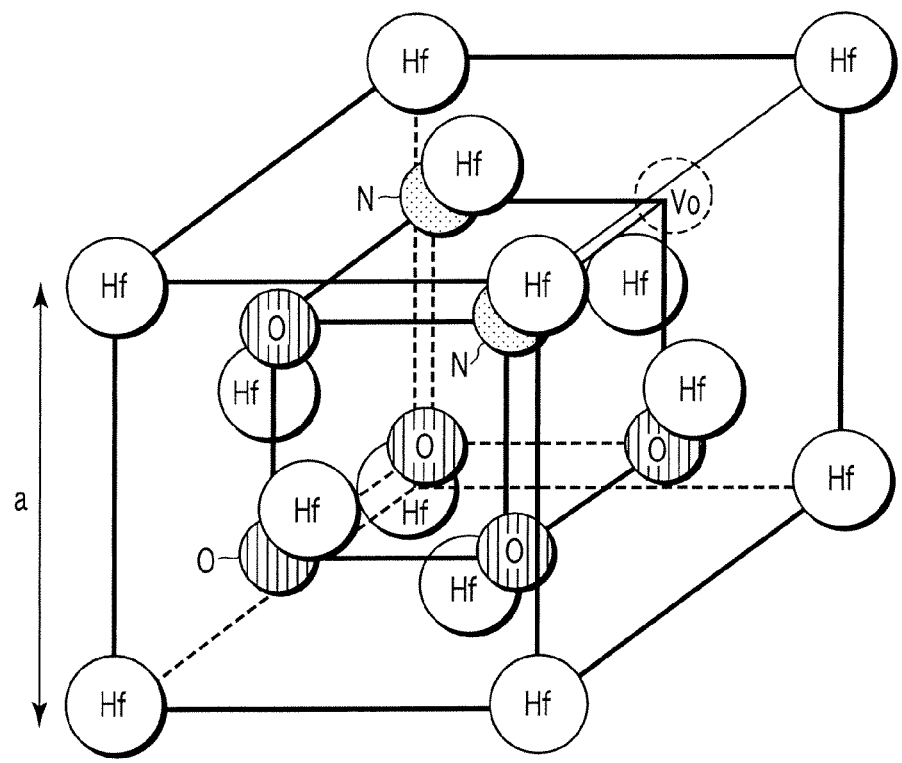
Figure 5B:
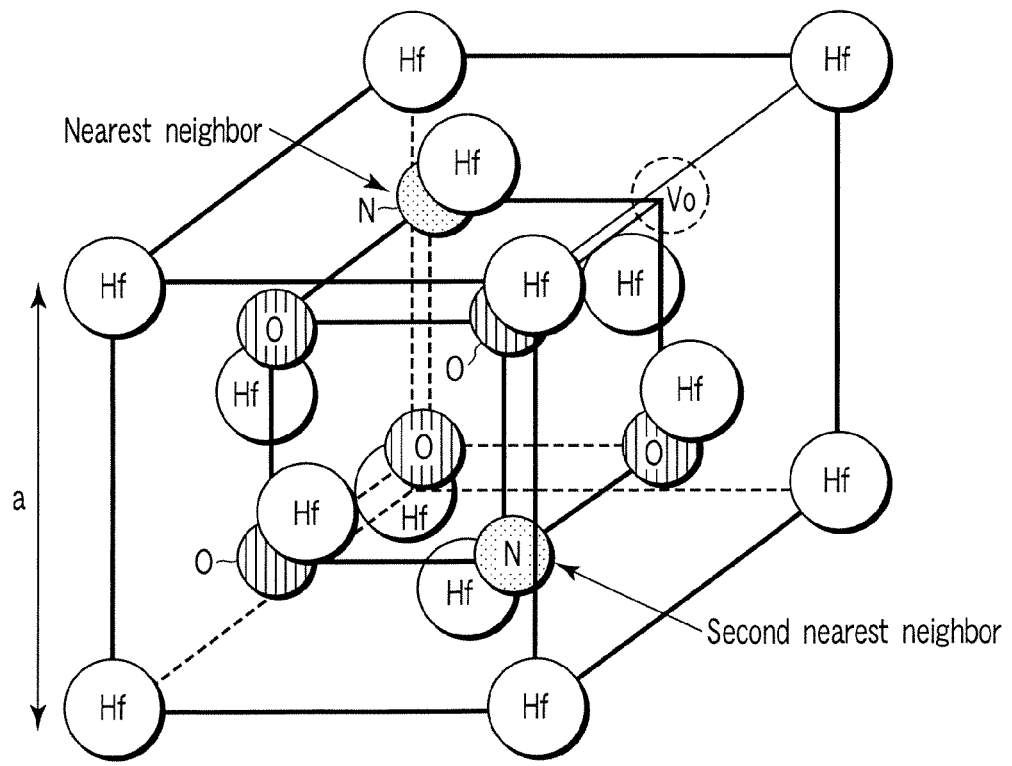
Figure 6:
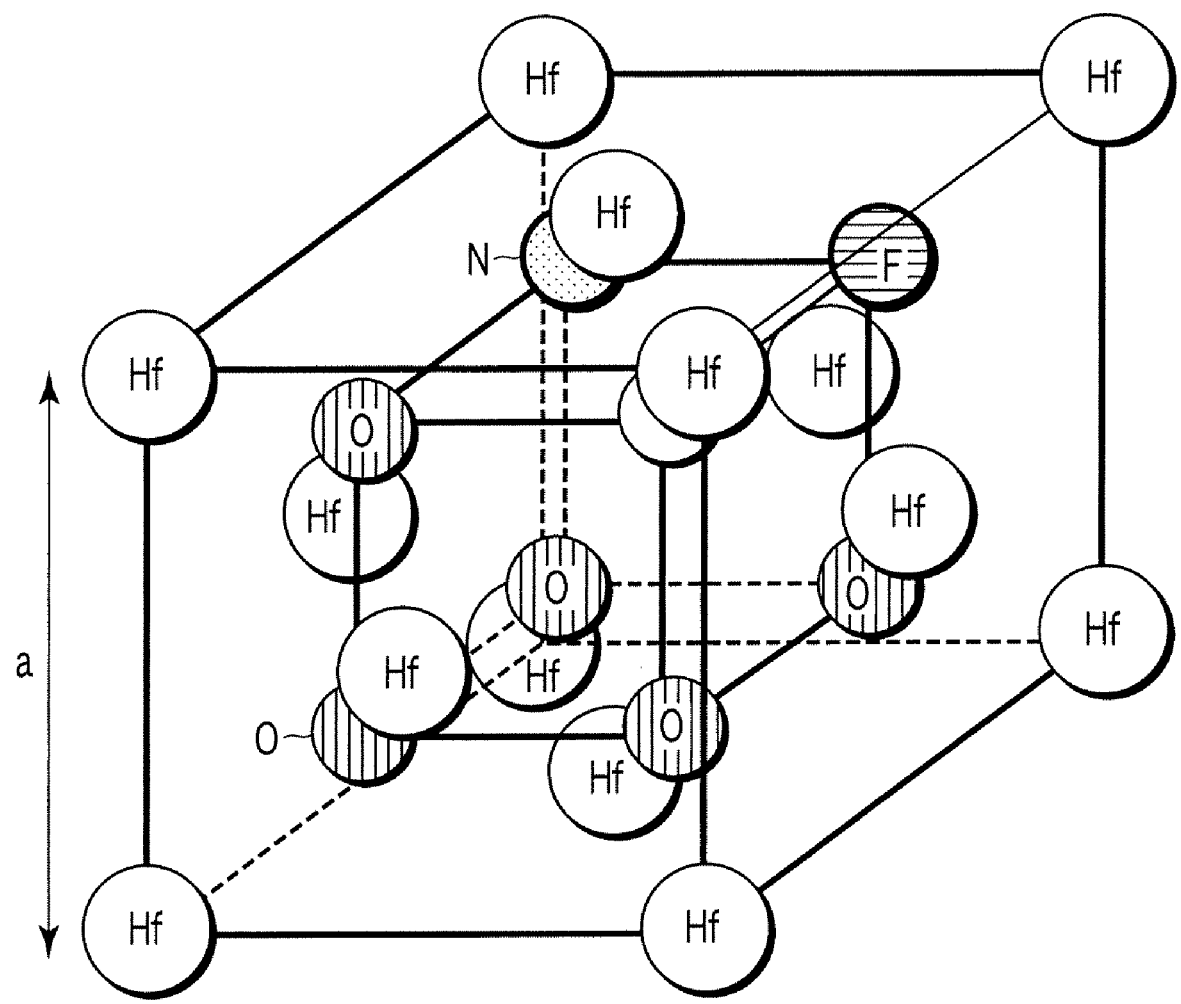
FIG. 6 is a block diagram showing an N—F pair introduced into $HfO_2$.

When N is taken into the HfO2 basic structure, there can be considered two structures, i.e., an "NVoN" structure (a nearest neighbor), in which two atoms of N and the oxygen vacancy are nearest to each other, as shown in FIG. 5A, and an "NVo+N" structure (a second nearest neighbor) in which one atom of nitrogen is separated. However, the difference in energy between these structures is approximately 0.2 eV. It is therefore natural to consider that the oxygen vacancy Vo occurs near one atom of nitrogen and an electron is supplied to the other atom of nitrogen. Here, it has been revealed from a first principles calculation that fluorine F is absorbed into a position of the oxygen vacancy Vo (FIG. 6) when it is introduced from the outside, and an energy gain of 4.2 eV can be obtained for each atom of fluorine. Thus, the electronic state which is short of electrons appears. Furthermore, as shown in FIG. 6, F and N are adjacent to each other to form a pair.

Here, when each atom of nitrogen N and each atom of fluorine F form a pair, it is known that they are stabilized through exchange of electrons (FIG. 2B). Therefore, if the pair of nitrogen and fluorine is excluded out of consideration, it can be understood that one atom of nitrogen N is the remainder. One oxygen vacancy Vo is produced for every two atoms of nitrogen N by the same mechanism as that explained above. At this time, oxygen ($O_2/2$) is discharged, and a low-K dielectric layer or the like is generated. Therefore, it is desirable to adopt a structure that allows oxygen to be discharged to the outside. The energy gain in the process of discharging oxygen and taking in fluorine is 4.7 eV for each atom of fluorine, and hence it is very large.

It can be considered that the amount of nitrogen N is finally equalized to the amount of fluorine F by repeating the above-explained process. Highest is the possibility that F and N forms a pair in proximity to each other, and the most stabilized state is obtained at this moment. When an amount of fluorine is insufficient, the process is broken off. However, the process may possibly stop in a state where the number of electrons is unsuitable, and hence caution is required. Even in this case, the number of electrons can be adjusted through a thermal process in which the oxygen vacancy Vo is produced, which produces the structure shown in FIG. 2A.

Film Formation Embodiment 1

FIGS. 7A to 7D show a Film Formation Embodiment 1 intended to introduce fluorine and nitrogen in equal portions. An $HfO_2$ film is formed on a silicon substrate 1 subjected to element isolation and channel doping (e.g., introduction of phosphor P or boron B) by a CVD method, and plasma nitriding is carried out at a room temperature to form an HfON film 2. A SiO2 film 3 is formed with a film thickness of 10 nm on this film 2 (FIG. 7A). Then, fluorine F is introduced by an ion implantation method to implant F in the HfON film 2. Here, the $SiO_2$ film 3 is a film that protects a surface of the HfON film 2 from damage and, at the same time, and it is a sacrificial film that is used to adjust an F concentration peak to be positioned in the HfON film 2.

Then, after peeling off the surface $SiO_2$ sacrificial film 3, a heat treatment is performed at 900° C. for 30 seconds (FIG. 7C). At this time, excessive F and an oxygen gas $O_2$ in the HfON film 2 are diffused to the outside.

Then, a polysilicon film 5 is formed to be an electrode layer later (FIG. 7D). Although subsequent steps are not shown, gate formation, sidewall formation, and ion implantation (e.g., a P or B ions) in the source/drain region, simultaneously in the electrode, spike annealing at 1050° C. and $H_2$ sintering are effected, thereby forming an MISFET (an MOSFET).

Since the above-described film formation process has some notable features, these features will be described below.

(1) A large amount of fluorine must be introduced into the gate insulating film. Immediately after ion implantation, fluorine whose amount exceeds the amount of nitrogen is introduced. The amount of nitrogen becomes equal to that of fluorine by the process shown in FIG. 3, and hence the entire film enters the most stabilized state. Excessive fluorine is discharged to the outside. When fluorine is excessive, a temperature not greater than 95° C. is desirable. That is because interstitial fluorine may possibly be substituted by oxygen when the temperature exceeds 950° C. After discharging excessive fluorine to the outside at a temperature that is not greater than 950° C., increasing the temperature to 950° C. or above involves no problems at all. Therefore, even if an electrode is formed by spike annealing or the like at 1050° C., no problem occurs.

(2) In the above example, ions are implanted into not only the gate insulating film but also a channel. However, when the annealing process is carried out at 900° for 30 seconds or more, fluorine in the channel is discharged to the insulating film side. Controlling the temperature enables controlling the discharge or non-discharge of fluorine in the channel.

(3) When fluorine is introduced into the channel, a channel impurity concentration can be controlled. However, annealing must be restricted to a range of 600° C. to 850° C. When a temperature becomes 600° C. or above, fluorine tends to diffuse in Si. In annealing at 850° C. or below, fluorine accumulates on an interface of a silicon substrate and a gate insulating film to assume the same role as counter doping. As a structure of fluorine realizing counter doping, the following two structures can be considered. One is a structure where electrons discharged from phosphor (P) are received to deactivate both phosphor and fluorine. The other is a structure where fluorine enters a silicon vacancy, and a state with a negative charge thereby occurs. As a result, Vth can be controlled. Further, the fact that adjustment can be carried out at a position very close to the interface alone (concentrated on approximately 1 nm) is one difference from the conventional method of counter doping.

Consideration will now be given as to a case where doped fluorine is concentrated within a width of approximately 1 nm in a film thickness direction of the channel and distributed with a surface density of $\sigma[C/cm^2]$. At this time, approximately $Vth[V] \cong 1.8 \times 10^{-14} \times \sigma$ is expected. Considering a range that is meaningful as a Vth shift amount, the surface density on the interface is not smaller than $5 \times 10^{12}/cm^2$ and not greater than $5 \times 10^{13}/cm^2$. Here, as to the meaningful range, a PMOS using a metal oxide involves a problem that Vth shifts approximately 0.6 V to be pinned, and hence 0.1 to 1.0 [V] is significant when this Vth shift is considered. Deviating from this range is not meaningful. However, considering a distribution of F in the film thickness direction as well, a change accompanied with a lower limit of approximately 0.5-fold and with an upper limit of approximately two-fold is allowed. Therefore, considering the distribution of F in the film thickness direction, the surface density of fluorine is not smaller than $2.5 \times 10^{12}/cm^2$ and not greater than $1 \times 10^{14}/cm^2$. This numeric value is obtained when fluorine accumulates near the interface, and it can be said that this is a very high concentration. In the case of a regular counter dopant, e.g., boron, realizing a high concentration like the above value in the narrow width is difficult.

(4) In the case of an nMOS, controls of (2) and (3) mentioned above are not required, which differs from a pMOS, and performing annealing at a temperature that is not lower than 850° C. and not greater than 950° C. enables discharging fluorine from the channel and sending it into the insulating film. An nMOS side is first formed by annealing at 950° C. in accordance with the above-explained film formation, fluorine is passed into the insulating film to improve film characteristics, and a structure where fluorine is discharged from the channel is created. Then, on a pMOS side, a method of performing annealing at 850° C. to leave fluorine in the channel (near the interface) and achieving both control over Vth and an improvement in film characteristics can be considered. However, in order to leave fluorine in the channel, subsequent activation annealing must be effected at 850° C. or below. It can be said that using activation annealing at a low temperature or using a damascene process or a metal electrode can realize a sufficiently feasible CMOS forming temperature.

(5) An example where an amount of fluorine is insufficient will now be considered. When the number of electrons is insufficient due to introduction of nitrogen, a temperature of 500° C. or above is required to supplement this insufficiency with oxygen vacancies after the introduction of nitrogen. In this case, even if the amount of F is not enough and a process is terminated during the flow of FIG. 3, a local occurrence of a p-type region can be avoided. This does not result in a problem as long as annealing process at 850° C. is performed.

Film Formation Embodiment 2

As a film formation method of a metal oxide film, various methods are known besides the CVD method. For example, there are an evaporation method, a sputtering method, and an atomic layer deposition (ALD) method, and others, and any method can be used. When an insulating film is deposited, and then nitriding and fluorination are simultaneously carried out by using a gas containing F while performing plasma nitriding, a low temperature can suffice. For example, exposure to a mixed gas containing an $NF_3$ gas, an argon gas, and an excited nitrogen gas is performed, and heating is performed at a low temperature (100° C.), and fluorine and nitrogen can be simultaneously introduced into a gate insulating film $HfO_2$. Here, even if $PF_3$, excited oxygen, and excited fluorine substitute for the above-described materials or they are used together with the above-described materials, nitrogen and fluorine can be likewise introduced. In this case, differing from the film formation process involving introducing fluorine after introduction of nitrogen, a big advantage is that a film can be formed while maintaining equal amounts of nitrogen and fluorine, and forming the most stabilized structure from an initial stage of film formation.

(Optimum Amounts)

In the case of an ionic oxide dielectric film containing a metal and oxygen, when both fluorine F and nitrogen N are added, optimum amounts are as follows. First, when the amount of fluorine is smaller than or substantially equal to that of nitrogen, the amounts are appropriate. Here, the number of oxygen vacancies Vo corresponds to ½ of an amount of residual nitrogen, and hence $\{[N]-[F]\}/2$ is achieved. When this amount becomes equal to or above 8.4 atomic %, the oxygen vacancies Vo interact with each other, and a band due to the oxygen vacancies Vo occurs in a band gap. Therefore, $\Delta Ec$ is reduced, and hence this 8.4 atomic % is an upper limit.

Figure 8:
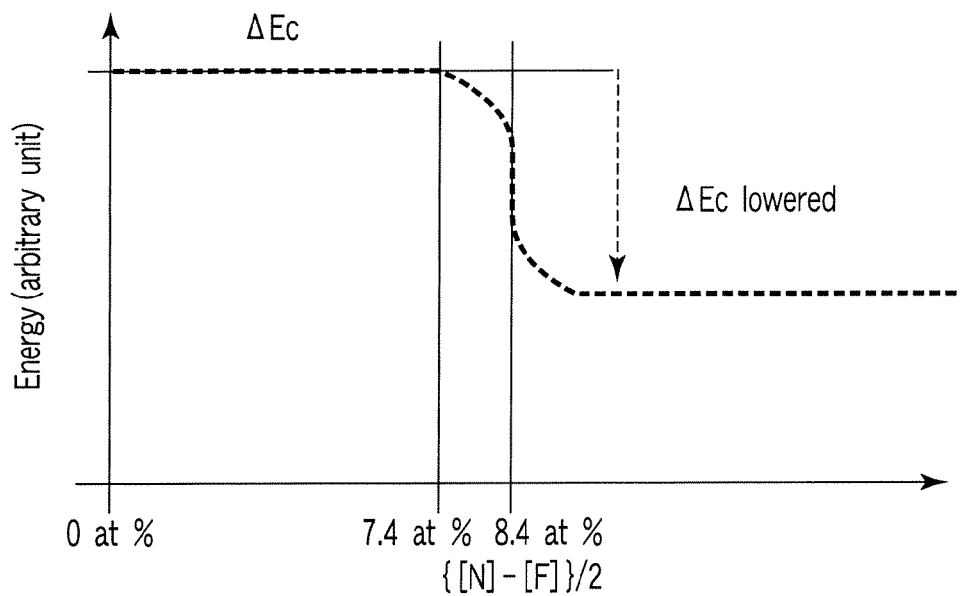
FIG. 8 is a characteristic view for explaining that a band offset ($\Delta Ec$) precipitously varies when $\{[N]-[F]\}/2=7.4$ to $8.4$ atomic %.

Furthermore, $\{[N]-[F]\}$ can be basically set to zero or a positive value. This is because the film formation process of the present embodiment enables preventing excessive fluorine from being taken into the film. Therefore, it can be considered that this value is sufficiently larger than at least −1.0 atomic %. Therefore, in this embodiment, −1.0 atomic % $\leq \{[N]-[F]\}/2 \leq 8.4$ atomic % is determined. Preferably, −1.0 atomic % $\leq \{[N]-[F]\}/2 \leq 7.4$ atomic % can be determined. It is acceptable if this value is zero or a positive value close to zero, but setting this value as 7.4 atomic % or below at a maximum is preferable. This is because a precipitous reduction in $\Delta Ec$ takes place when this value exceeds 7.4 atomic %, as shown in FIG. 8. This reduction is realized due to the occurrence of a virtual intermediate state in a gap, based on the interaction of oxygen vacancies.

Moreover, in view of the structure, 0.0 atomic % $\leq [N]+[F] \leq 50.0$ atomic % must be achieved. When $[N]+[F]$ exceeds 50.0 atomic %, the amount of oxygen is extremely reduced, and the structure cannot be maintained. In order to maintain a high dielectric constant as an oxide, it is desirable for the amount of oxygen to be 33.3 atomic % or above. Therefore, achieving 0.0 atomic % $\leq [N]+[F] \leq 33.4$ atomic % is desirable in terms of dielectric characteristics.

Additionally, in the film formation process, the initial introduction of nitrogen can be considered. Based on an experiment, it has been revealed that an amorphous state cannot be maintained if the amount of nitrogen introduced into an $HfO_2$ film or the like is smaller than 16.7 atomic %. At this time, an NVoN structure serves as pins that suppress a change in the structure. It can be said that the number of pins is equal to the number of oxygen vacancies, which is 8.4 atomic % (or more precisely, 8.35 atomic %). It can be considered that N—F pairs also serve as pins, and it can be said that the number of the pairs matches with the amount of fluorine [F]. Therefore, it is preferable for the sum of quantities of oxygen vacancies $\{[N]-[F]\}/2$ and [F] that do not form pairs to be not smaller than 8.35 atomic %. That is, $[N]+[F]$ should be not smaller than 16.7 atomic %.

When nitrogen is first introduced and then F is introduced, 16.7 atomic % or more is required as an amount of nitrogen, as explained above. However, when F and N are simultaneously introduced from an initial stage of film formation, a large amount of nitrogen does not have to be introduced. In this case, it is good enough for the amount of nitrogen to be equal to that of the amount of fluorine.

Figure 9:
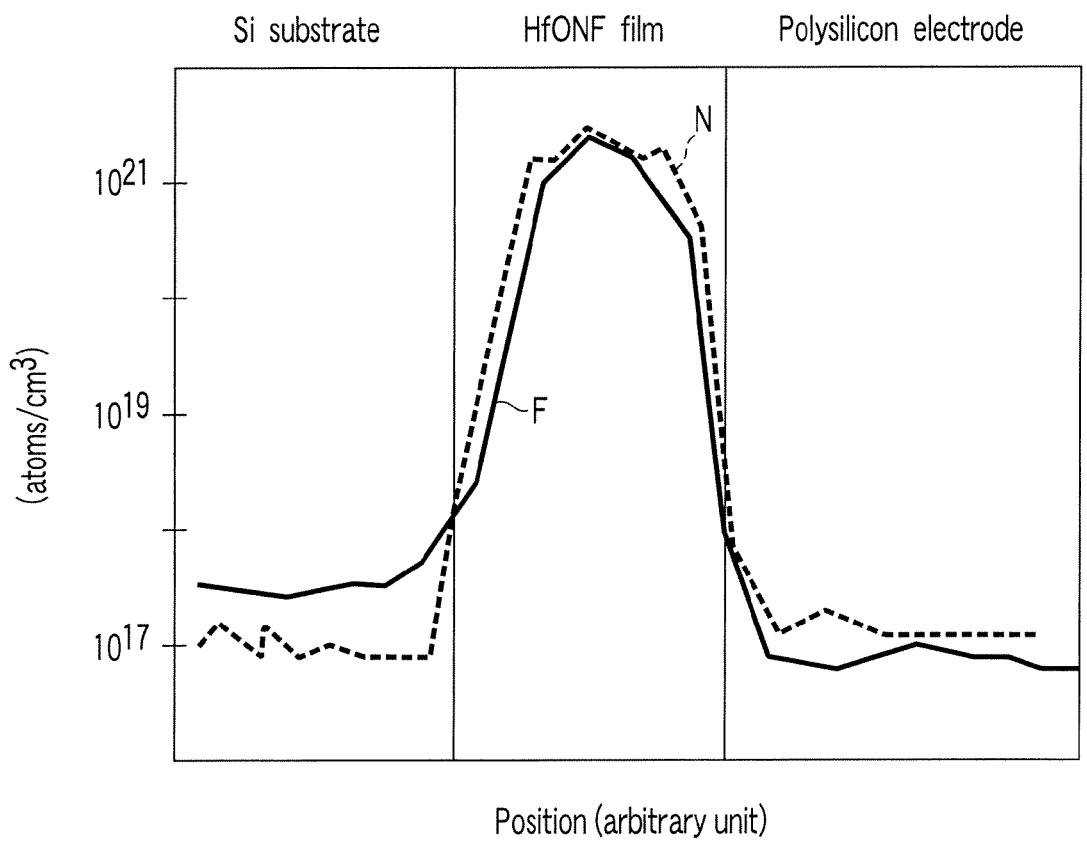
FIG. 9 is a characteristic view showing a result of SIMS analysis of the insulating film structure depicted in FIG. 7D.

As described above, a state where the amount of [N] matches the amount of [F] is most preferable. Since an error in secondary ion mass spectrometry (SIMS) measurement also varies depending on materials, the error is very large. FIG. 9 shows an example of SIMS data. It is sufficient if −1.0 atomic % $\leq [N]-[F] \leq 1.0$ atomic % is achieved and distribution shapes match each other. If precise measurement is possible, achieving −0.1 atomic % $\leq [N]-[F] \leq 0.1$ atomic % is desirable. When the process according to this embodiment is used, achieving $[N] \geq [F]$ is fundamentally possible.

(Materials that Play the Same Roles of Nitrogen)

The above has explained that nitrogen assumes a primary role when introducing fluorine into an insulating film. However, the following explains that exactly the same effect can be obtained by introducing a cation having a valence lower than that of a metal as a core of a metal oxide.

A process in which nitrogen forms oxygen vacancies, and fluorine is filled in the oxygen vacancies and the entire structure is thereby stabilized was used. It was revealed from a first principles calculation that there is a process in which oxygen vacancies are likewise generated and the oxygen vacancies are filled with fluorine even if a metal element having a low valence is introduced, and that the entire configuration settles down in the most stabilized structure. An example where aluminum (Al) is introduced into $HfO_2$ in place of Hf was examined. FIGS. 10A to 10C show the result, and this example is closely similar to the example of nitrogen (FIGS. 2A to 2C).

As shown in FIG. 10A, four electrons are discharged from Hf, but three electrons alone are discharged from Al. As a result, there is a shortage of one electron. Consequently, an electron hole (a hole) is formed at the top of VB. At this time, when an oxygen vacancy occurs and a surplus electron (e) is present, this electron closes the electron hole (h) near the top of VB, thereby reducing the total energy. This is the mechanism of generation of oxygen vacancies involved due to introduction of Al, as seen from a microelectronic point of view. Further, FIG. 10C is a diagram showing the case of when F alone is added.

When a large amount of Al is introduced, phase separation occurs due to the difference in lattice constant. This can be also considered as a phenomenon that occurs due to free movement of the oxygen vacancy. Here, as shown in FIG. 10B, since the oxygen vacancy is filled with fluorine, phase separation can be avoided even if a large amount of Al is added. Phase separation triggered by a displacement of the oxygen vacancy also occurs. When an element having a low valence and a large ion radius is introduced. However, the same mechanism can avoid phase separation even when La is introduced. This avoidance of phase separation is one of the effects obtained by eliminating the oxygen vacancy through introduction of fluorine.

At this time, $\Delta Ec$ and $\Delta Ev$ are also improved as compared with the example of nitrogen. In the case of nitrogen, a decrease in $\Delta Ev$ is observed due to nitrogen. However, in the case of Al, this decrease does not occur, and there is no problem with $\Delta Ev$. Furthermore, since the energy level of F is lower than that of oxygen, the energy level of oxygen is drawn downwards by that of F (FIG. 10B). That is, $\Delta Ev$ is increased, and characteristics are improved. However, the factor causing the reduction in $\Delta Ec$ is the same as that in the example of nitrogen, i.e., the oxygen vacancy. Therefore, the range of $\Delta Ec$ is exactly the same as that for nitrogen.

FIG. 11A is a structural drawing when Al (a trivalent metal element) is added in $HfO_2$. One atom of Hf is substituted by Al, an oxygen vacancy is filled with F, and Al is in close proximity to F to form a pair. As shown in FIG. 13B, which will be explained later, a Ba—F pair in $LaAlO_3$ (a trivalent core metal) likewise forms a 1:1 pair. FIG. 11B is a structural drawing when Ba as a divalent metal element is introduced into $HfO_2$, and F, Ba, and F are coupled with each other in close proximity. As to F—Ba—F, there is, e.g., a structure where F, Ba, and F are substantially linearly aligned as another structure of FIG. 11B. FIG. 12A shows this state. This structure is provided when one atom of F is present at an oxygen position in an adjacent unit cell. Moreover, as shown in FIG. 12B, there is also a state where F substitutes for oxygen that is present on a diagonal line within the same plane formed by oxygen. Since eight oxygen atoms are present around Ba at equal intervals, an example where two of these atoms are substituted by F is considered.

Meanwhile, in order to exercise an effect of this embodiment, the following conditions are required. That is, since $\{[Al]-[F]\}/2$ is the number of oxygen vacancies, this must be not greater than 8.35 atomic %. Since [F] substitutes for an oxygen position, an amount of [F] must be ½ or below of an oxygen amount, i.e., 33.4 atomic % or below in order to maintain the structure as a dielectric. Since [Al] substitutes for an Hf position, the amount of [Al] must be ½ or below the Hf amount, i.e., 16.7 atomic % or below in order to maintain the structure as the dielectric. Optimum amounts are likewise provided when [Al]=[F].

In regard to substitution, maintaining substitution of ½ or below with respect to each of a cation part and an anion part is the necessary minimum condition in order to hold the dielectric structure. Some examples are explained below. Since $HfO_2$ includes 33.3 atomic % of the cation and 66.7 atomic % of the anion, ½ of each of these amounts, i.e., 16.7 atomic % and 33.4 atomic % are an upper limit.

$LaAlO_3$ having a perovskite structure takes such a configuration as shown in FIGS. 13A and 13B. The cation to be substituted is turned into La or Al (FIG. 13A). Each of La and Al has an amount of 20 atomic %, and an amount of the anion is 60 atomic %. Therefore, 10 atomic % and 30 atomic % are upper limits. For example, when simultaneously introducing Ba and F into $LaAlO_3$ (FIG. 13B), conditions that $0 \leq [Ba] \leq 10$ atomic % and $0 \leq [F] \leq 30$ atomic % are provided. In this case, Ba enters in place of the trivalent metal element La, and F enters in place of O.

Ca will now be also considered. In regard to many materials, like Ca or Y, the fact that an oxygen vacancy readily moves to turn in an ionic conductor is known. Crystallization readily occurs, and a gate insulating film having very low reliability alone is produced due to oxygen vacancy mobility or trapping charges. However, when fluorine is introduced, this movement of an oxygen ion is assuredly interrupted. Therefore, a material used as such an ionic conductor can be used for a gate insulating film. Moreover, $\Delta Ev$ and $\Delta Ec$ of a material having fluorine introduced simultaneously with a material such as Ca or Y are better than those of Al. In regard to optimum amounts, the amount of Y in $HfO_2$ is the same as that of Al in $HfO_2$, and the amount of Ca in $HfO_2$ is the same as that of Ba in $HfO_2$.

Addition of Ba will now be considered. Addition of Ba is originally considered as a major candidate. However, when fluorine is introduced, an oxygen vacancy that occurs due to dissociation does not have to be considered, thereby extremely improving characteristics. In particular, an addition amount does not have to be restricted to an amount as small as in the conventional technology, and introducing an amount based on use of nitrogen can suffice. However, when a valence difference is 2, (the valence difference 2)×[a divalent element] is assigned to the expression in place of [N]. This means that the amount of fluorine multiplied by a number corresponding to the valence difference is required.

Basically, it is good enough to effect classification based on a valence difference between a core metal and a metal to be added. In regard to the optimum amount, achieving 2[Ba]=[F] and $\{2[Ba]-[F]\}/2 \leq 8.4$ atomic % is preferable, and attaining $\{2[Ba]-[F]\}/2 \leq 7.4$ atomic % is more preferable. Moreover, the conditions of 0<[Ba]<16.7 atomic % and 0<[F]<33.4 atomic % are the same as those in the case of Al.

When considered in this manner, introducing a material having a valence lower than that of a core metal allows an oxygen vacancy to be introduced, and this oxygen vacancy is filled with fluorine. It can be understood that this process is achieved in relation to many materials.

As a quadrivalent metal element that is a core metal, Hf, Zr, or Ti is optimum, and adopting at least one of these materials can suffice. At this time, as a material to be added, a trivalent metal element or a divalent metal element can be considered. As a trivalent metal element, La or Al is optimum. There is basically a tendency that phase separation occurs due to the magnitude of the ion radius. However, it can be said that this tendency is owing to the fact that an oxide is stable. Additionally, when fluorine is introduced, this concern is cleared. In terms of ion radius and stability, La or Al is most effective.

Further, a group of elements including Sc, Y, Ce, Pr, Nd, Pm, Sm, Eu, Gd, Tb, Dy, Ho, Er, Tm, Yb, and Lu is also effective. They are elements that may possibly form an ionic conductor, but this concern is cleared by simultaneously introducing fluorine. That is, these elements, which were not suitable for an insulating film in the conventional technology, demonstrate very effective characteristics as an insulating film by simultaneously introducing fluorine. This fact is presented for the first time through this embodiment. A material having such elements introduced therein has a very high structural stability, and hence it is a very important material in this viewpoint.

As a divalent metal element, Mg, Sr, or Ba is optimum. These materials have a problem of dissociation from an oxygen vacancy, and hence they can be introduced at a low concentration alone. However, there is no problem when introduced simultaneously with fluorine. Furthermore, Ca can be also considered. This is a material that may possibly form an ionic conductor, but this concern is cleared when fluorine is simultaneously introduced. A material having such elements introduced therein has a very high structural stability, and hence it is a very important material in this viewpoint.

As a trivalent metal element that is a core metal, La, Al, or Y is optimum, and adopting at least one of these materials can suffice. For example, $LaAlO_3$, $YAlO_3$, $La_2O_3$, $Al_2O_3$, $Y_2O_3$, and others are effective in terms of stability and dielectric characteristics. As a material to be added to an oxide having such a trivalent core metal, a divalent element (Ba, Sr, Ca, or Mg) can be considered.

(Valence Number Difference)

Here, a valence number difference between oxygen and nitrogen or that between the core metal and a metal to be added will be discussed with respect to amount to be added. As aforementioned, fluorine substitutes oxygen. Oxygen receives two electrons, but fluorine receives only one electron. Thus, there will be one excessive electron.

When a material to be added is a metal, the material substitutes the core metal. In this case, a valence number of the substituting metal is lower than that of the core metal. The number of released electrons is made smaller by the valence number difference. The use of this characteristic will make it possible not to release from the first the above electrons which fluorine cannot receive. Electrons corresponding to the valence number difference are not released so that electrons moving in and out are balanced when the valence number difference multiplied by the amount of the material to be added is matched with the fluorine amount.

When nitrogen is added and replaces oxygen, an excessive electron is accompanied. As the valence number difference is one, the nitrogen amount is made to be matched with the fluorine amount.

For example, study will be made with a case that Ba, which is divalent, is added to $HfO_2$, which includes a quadrivalent metal Hf. Hf is ready to release four electrons (to be $Hf^{+4}$), and Ba is ready to release two electrons (to be $Ba^{+2}$). That is, Ba addition eliminates two electrons to be released. In another word, electrons shortage occurs. If two fluorine atoms substitutes two oxygen atoms, there are two excessive electrons, with result that unbalance of electrons are canceled. In this case, the valence number difference is two, and the added material is a divalent material, so that the valence number difference k×the amount of the added material [X] is 2×[divalent]. That is, $\{k \times [X] - [F]\}/2 \leq 8.4$ atomic % is identical to $\{2 \times [divalent] - [F]\}/2 \leq 8.4$ atomic %.

(Prior Document)

JP-A 2002-299614 (KOKAI), mentioned above, describes the role of F in an insulating film. What is described is that a small number of vacancies that occur on an earlier stage of a film is reduced by using a small amount of fluorine. The contents do not mention the introduction of fluorine by using nitrogen or a metal element having a low valence, but teaches that the amount of fluorine to be introduced into a film is also very small. On the contrary, in our proposal of the present embodiment, fluorine is caused to interact with an oxygen vacancy that newly appears due to introduction of nitrogen or the metal element having a low valance to thereby construct a stabilized structure. Thus, provided is a novel film that does not induce a reduction in $\Delta Ec$ and in $\Delta Ev$, which is involved by introduction of nitrogen or a metal element having a low valence number.

First Embodiment

Figure 14:
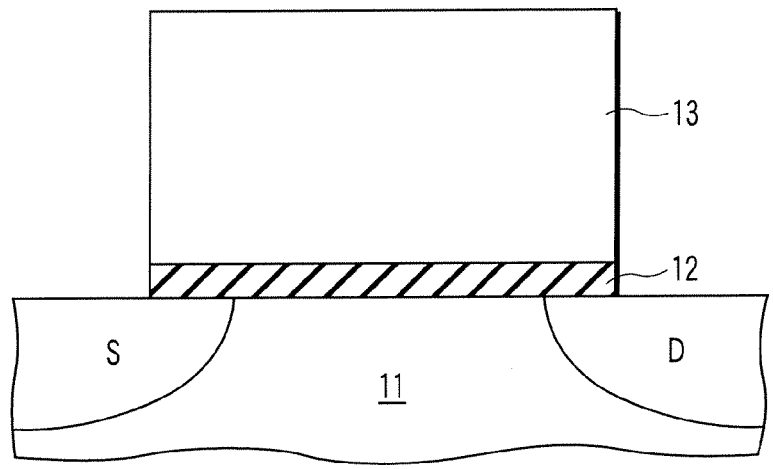
FIG. 14 is a cross-sectional view of an MISFET according to a first embodiment.

An MISFET including the above-described oxide film will now be explained as a first embodiment with reference to FIG. 14. FIG. 14 is a cross-sectional view showing a primary part of an MISFET according to the first embodiment, and the MISFET includes a substrate 11, a source region S, a drain region D, a gate insulating film 12, and a gate electrode 13. The substrate 11 is constituted of, e.g., silicon. The source region S and the drain region D are formed on a surface of the substrate 11. The gate insulating film 12 is formed of an oxide according to this embodiment, as will be explained later, and provided on a channel region formed between the source region S and the drain region D. The gate electrode 13 is provided on the gate insulating film 12.

A manufacturing process of the MISFET depicted in FIG. 14 will now be explained. First, a clean surface of the Si substrate 11 having a main surface (001) is exposed. At this step, HF (a fluorinated acid) processing that is usually used is carried out, then a very thin oxide film $SiO_2$ is formed by ozone oxidation at a room temperature, and subsequently such surface is protected.

Then, this Si Substrate 11 is carried to a sputtering apparatus, an impurity on the outermost surface is sputtered and removed in an ultrahigh vacuum at 250° C., and then the temperature is increased to 880° C. to sputter and remove the oxide film $SiO_2$ on the surface. At this time, the clean surface appears, and reflection high energy electron diffraction (RHEED) can be used to confirm that a 2×1 structure is provided.

Subsequently, an amorphous $HfO_2$ film as the gate insulating film 12 is formed by sputtering at a high temperature of 800° C. A film thickness of $HfO_2$ is set to 4 nm. In this example, an oxygen partial pressure is set to become zero from an initial stage of film formation, and the film is formed in a reducing atmosphere.

Then, the $HfO_2$ film is subjected to plasma nitriding at a room temperature. The amount of nitrogen to be introduced is approximately 12 atomic %. A film of $SiO_2$ is formed thereon, and fluorine is ion-implanted with, e.g., an accelerating voltage of 80 keV and a dose amount of $1 \times 10^{15}/cm^2$. Further, the accelerating voltage is oscillated to exercise an ingenuity in such a manner that the amount of fluorine becomes uniform in the depth direction of the insulating film by repeatedly implanting fluorine ions at different depths. Fluorine to be ion-implanted is implanted in the form of $F^+$.

Then, the $SiO_2$ film formed on the surface is removed. Furthermore, rapid thermal annealing (RTA) is carried out at 900° C. for 30 seconds. Subsequently, a film of gate electrode polysilicon is formed and processed into the gate electrode 13. Thereafter, although not shown, gate-sidewall formation is effected, followed by ion implantation (a P ion) to the source/drain region, simultaneously to the gate electrode, spike annealing at 1050° and $H_2$ sintering are carried out. FIG. 9 shows a result of analyzing a fluorine concentration distribution and a nitrogen concentration distribution by using a secondary ion mass spectrometer (SIMS) at this time. The fluorine concentration distribution substantially overlaps the nitrogen concentration distribution, and it can be considered that they match with each other, based on the level of accuracy of SIMS analysis. That is, this drawing shows that fluorine can be present near nitrogen in a 1:1 relationship according to the film formation method in this embodiment. Although the sputtering method is used as the film formation method in this example, substantially the same result was obtained when an MBE method, a CVD method, an ALD method, and others were used.

In regard to the thus obtained n-type MISFET, characteristics in the example where fluorine is added were compared with characteristics in an example where fluorine is not added. First, in both the examples with/without addition of fluorine, the gate insulating film 12 was a gate insulating film having a film thickness (EOT) of 0.65 when converted into a SiO2 film thickness.

Further, when a leakage current when a large electric field of 5 MV/cm is applied was measured, the leakage current was not greater than 1.0 A/cm$^2$ before addition of fluorine, but it was greatly reduced to 0.0005 A/cm$^2$ after addition of fluorine. Although a small crystal is precipitated in the film before fluorine is added, an amorphous structure is maintained in the film after fluorine is added.

Then, a comparison examination was performed with respect to HfON as a generally used $HfO_2$ film having a large amount of nitrogen added therein. The amount of nitrogen was set to approximately 24 atomic %, which is double the amount of that in the above example. At this time, the original amorphous structure is maintained. However, when a leakage current when a large electric field of 5 MV/cm is applied was measured, the leakage current in the film after addition of N was approximately 0.1 A/cm$^2$. An improvement with an order of magnitude can be seen as compared with $HfO_2$, and that is because the amorphous structure is maintained. It can be understood that the leakage current after addition of fluorine is much lower than this value. In the addition of nitrogen in a regular HfON film, a band offset ($\Delta Ec$) on a conduction band side is reduced by approximately 0.5 eV. This is the primary reason why leakage characteristics are not sufficiently improved. On the contrary, when fluorine is added, since $\Delta Ec$ is not reduced, essential characteristics of $HfO_2$ can be demonstrated in accordance with merits thereof.

Further, paying notice to a time-based change when a voltage is applied, a film in which no fluorine is introduced was destroyed in approximately eight hours. On the other hand, a film in which 12 atomic % of nitrogen and 12 atomic % of fluorine are simultaneously introduced was not destroyed even after several days.

Moreover, before introduction of fluorine, a phenomenon in which a threshold voltage shifts with time considerably appeared, and a shift of approximately 100 mV or above was observed in approximately one hour. A shift of 100 mV was likewise observed in the film having nitrogen introduced therein after eight hours. In the film having nitrogen added therein, it can be considered that a shift occurs due to a weak oxygen vacancy fixing force. On the contrary, a shift of approximately 10 mV is maintained in the film having nitrogen and fluorine simultaneously introduced therein even after several days, and almost no change is observed thereafter. This is because a change in structure due to an oxygen vacancy or charge trapping is eliminated as film characteristics.

The p-type MISFET was likewise examined. The $HfO_2$ alone has a problem of crystallization, and a reduction in a band offset occurs in the film having nitrogen added therein. However, a reduction in a band offset can be suppressed in the film having nitrogen and fluorine simultaneously added therein. As a result, a pMOSFET having excellent leakage characteristics was obtained. Furthermore, in regard to long-term reliability, the same effect as for the n-type MISFET was realized.

In regard to the p-type MISFET, fluorine can be introduced into an interface between the Si substrate and the insulating film on the Si substrate side in the channel at a high concentration by changing a process temperature. In order to realize this, RTA thermal processing was carried out at 800° C. for one minute in the above-explained process in place of RTA at 900° C. for 30 seconds. Since fluorine originally present in the insulating film assumes the same role, insulating film characteristics are improved in exactly the same manner. However, the behavior of fluorine introduced into the channel becomes totally different. In RTA at 900° C. for 30 seconds, fluorine is discharged from the channel. However, in RTA at 800° C. for one minute, a large amount of fluorine remains in the interface to a depth of approximately 1 nm as negative electric charges to change Vth. This is effective as a method of avoiding Vth pinning in the pMISFET using the gate insulating film. In this embodiment, approximately $1 \times 10^{13}/cm^2$ of fluorine as a surface density was introduced. The surface density of fluorine is adjustable based on an ion implantation amount and a temperature, and Vth is also adjustable.

The effect of fluorine in the film greatly contributes to an improvement in film characteristics. As seen in the CV curve, the angular shape is excellent, and a precipitous curve is drawn. On the other hand, fluorine in the interface provides a shift of a rising position of the CV curve. When the process of adding fluorine is successfully organized, both of them can be combined. The shift of the CV curve due to fluorine in the interface has a drawback that the angular shape of the CV curve is considerably deteriorated. It can be considered that deformation of the CV curve affects an operation of the MISFET to lower the current driving performance. Since the angular shape is improved when fluorine is introduced into the film, combining these effects can provide the CV curve shift due to fluorine in the channel, thereby obtaining a p-type MISFET having a shift of the CV curve with an excellent angular shape.

The effect in an improvement in film characteristics described above shows that an oxygen vacancy is eliminated by fluorine and that there is no bandgap narrowing or no level in the gap. According to the present invention, it has been revealed that characteristics and reliability of the gate insulating film are greatly improved.

Second Embodiment

Figure 15:
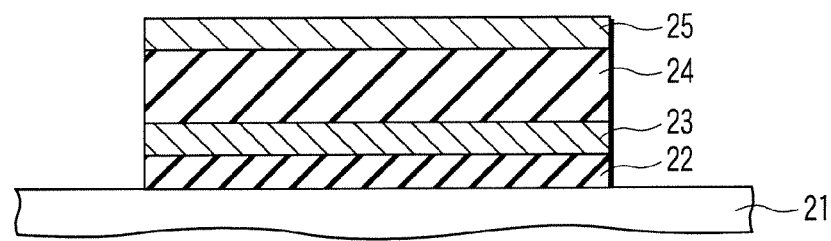
FIG. 15 is a cross-sectional view showing an MIM capacitor according to a second embodiment.

A metal insulator metal (MIM) capacitor including (Pt electrode)/(La added $HfO_2$)/(Pt electrode) will now be explained as a second embodiment with reference to FIG. 15. As shown in a cross-sectional view of FIG. 15, an MIM capacitor includes a substrate 21 as well as a buffer film 22, an electrode 23, a capacitor dielectric film 24, and an electrode 25 that are sequentially deposited on the substrate 21. The substrate 21 is constituted of, e.g., silicon. The buffer film 22 is formed of, e.g., amorphous TiAlN. The electrodes 23 and 25 are constituted of, e.g., Pt. As will be explained later, the capacitor dielectric film 24 is formed of a single layer of an oxide or a multiplayer of oxides according to this embodiment.

The manufacturing process of the MIM capacitor depicted in FIG. 15 will now be explained. First, a clean surface of the substrate 21 having a main surface (001) is exposed at the same step as that in the first embodiment.

Then, the buffer film 22, the electrode 23, and a film of $HfO_2$ as the capacitor dielectric film 24 is formed by sputtering at a high temperature of 800° C. A film thickness of $HfO_2$ is set to 10 nm. In this example, an oxygen partial pressure is set to zero from an initial stage of film formation by sputtering.

When forming the $HfO_2$ film, an $La_2Hf_2O_7$ target is introduced to carry out simultaneous sputtering. In this example, sputtering is effected in a reducing atmosphere. Here, the amount of La is very large, and it is approximately 10 atomic %. The amount of La is controlled by adjusting the application voltage to the target. In this example, the sputtering method is used as a film formation method, but substantially the same result can be obtained when an MBE method, a CVD method, an ALD method, and others are used.

A $SiO_2$ film is formed on the $HfO_2$ film, and fluorine is ion-implanted with, e.g., an accelerating voltage of 80 keV and a dose amount of $3\times10^{15}/cm^2$. Furthermore, the accelerating voltage is oscillated in such a manner that the amount of fluorine becomes uniform in the depth direction of the insulation film by repeatedly implanting fluorine ions at different depths. Fluorine to be ion-implanted is implanted in the form of $F^+$.

Then, $SiO_2$ on the surface is removed. Moreover, RTA is carried out at 900° C. for 30 seconds. Subsequently, a Pt film is formed as the electrode 25 by sputtering. When performing SIMS analysis with respect to distributions of the fluorine concentration and La concentration, the fluorine concentration distribution can be seen to substantially overlap the La concentration distribution, and it can be considered that they match with each other, based on the accuracy of SIMS analysis. That is, according to the film formation method in this embodiment, the fact that fluorine is present near La in a 1:1 relationship is demonstrated.

In regard to the thus obtained MIM capacitor, its characteristics were examined before and after addition of fluorine. First, in both cases, the capacitor insulating film 24 was a gate insulating film having a small equivalent oxide thickness (EOT) of 0.45 nm when converted into a $SiO_2$ film thickness.

Additionally, a leakage current when a large electric field of 5 MV/cm is applied was measured. The leakage current was not greater than 1.0 $A/cm^2$ before addition of fluorine, and it was greatly reduced to 0.005 $A/cm^2$ after addition of fluorine.

Further, in regard to a time-based change when a voltage is applied, the film having no fluorine added therein was destroyed within several hours, but the film having fluorine added therein was not destroyed even after several days.

Furthermore, in the case of the film having fluorine introduced therein, electric charges are stored with time. When a capacitance/voltage (CV) diagram is drawn, it shows a large hysteresis in an increasing/decreasing direction of the applied voltage. However, in the case of the film having fluorine introduced therein, hysteresis is 10 mV or below.

The effect of improving film characteristics explained above demonstrates that an oxygen vacancy is eliminated by fluorine and there is no bandgap narrowing or no level in the gap. According to this embodiment, it was revealed that characteristics and reliability of the capacitor dielectric film are greatly improved.

Third Embodiment

Figure 16:
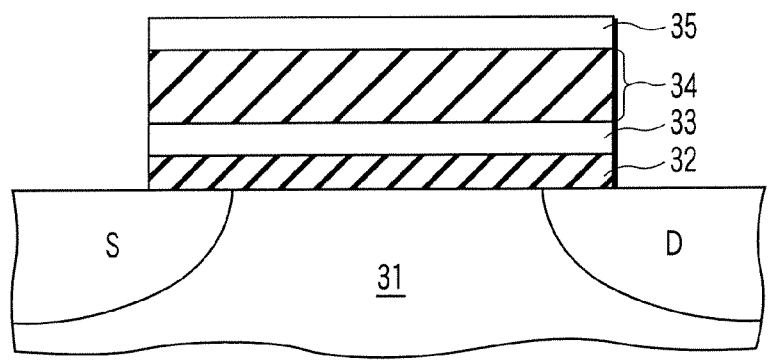
FIG. 16 is a cross-sectional view of a memory cell transistor according to a third embodiment.

A capacitor structure including polysilicon/HfAlO/polysilicon will now be explained as a third embodiment with reference to FIG. 16. This structure corresponds to an insulating film (a so-called inter-poly dielectric film) between a floating gate and a control gate of a cell transistor and its peripheral portion in a flash memory. As shown in a cross-sectional view of FIG. 16, the capacitor structure includes a substrate 31, and an insulating film 32, an electrode 33, a dielectric film 34, and an electrode 35, which are sequentially deposited on the substrate 31. The substrate 31 is formed of, e.g., silicon. The insulating film 32 is constituted of, e.g., amorphous SiON. The electrodes 33 and 35 are formed of polysilicon (P-doped). As will be explained later, the dielectric film 34 is constituted of an oxide according to this embodiment.

The manufacturing process of the capacitor according to the third embodiment will now be explained. First, a clean surface of the substrate 31 having a main surface (001) is exposed at the same step as that in the first embodiment.

Then, the insulating film 32, the electrode 33, and an HfAlO film as the dielectric film 34 is formed by sputtering at a high temperature of 800° C. A film thickness of HfAlO is set to 15 nm. In this example, an oxygen partial pressure is set to zero from an initial stage of sputtering film formation, and targets of $Al_2O_3$ and $HfO_2$ are used. The amount of Al in the formed HfAlO film is 11 atomic %.

Although the sputtering method is used as a film formation method in this example, substantially the same result can be obtained by, e.g., MBE method, a CVD method, or an ALD method.

A $SiO_2$ film is formed on the HfAlO film, and ion implantation of fluorine is carried out with, e.g., an accelerating voltage of 80 keV and a dose amount of $1\times10^{15}/cm^2$. Further, the accelerating voltage is oscillated in such a manner that the amount of fluorine becomes uniform in the thickness direction of the dielectric film by repeatedly implanting fluorine ions at different depths. Fluorine to be ion-implanted is implanted in the form of $F^+$.

Then, $SiO_2$ formed on the surface is removed. Furthermore, RTA is performed at 900° C. for 30 seconds. A polysilicon film is formed as the electrode 35 on the surface by sputtering. When performing SIMS analysis with respect to a fluorine concentration distribution and an Al concentration distribution at this time, the fluorine concentration distribution can be seen to substantially overlap the Al concentration distribution, and it can be considered that they match with each other, based on the accuracy of SIMS analysis. That is, according to the film formation method of this embodiment, the fact that fluorine can be present near Al in a 1:1 relationship is demonstrated.

Thereafter, a source region S and a drain region D are formed on the surface of the substrate 31 by, e.g., ion implantation to sandwich a channel region below the electrode 33, thereby forming a cell transistor of a flash memory.

Characteristics of the thus obtained capacitor before and after addition of fluorine were examined. First, in both cases where fluorine is added and not added, the capacitor dielectric film 34 was a gate insulating film having a small film thickness (EOT) of 2.5 nm when converted into a $SiO_2$ film thickness.

Moreover, a leakage current when a large electric field of 5 MV/cm is applied was measured. The leakage current was 0.1 $A/cm^2$ or below before addition of fluorine. The leakage current was greatly reduced to 0.0001 $A/cm^2$ after addition of fluorine.

Additionally, a time-based change when applying a voltage was observed. The film having no fluorine introduced therein was destroyed within several hours, but the film having fluorine introduced therein was not destroyed even after several days.

Further, before introduction of fluorine, electric charges are stored with time. A capacitance/voltage (CV) drawing shows a large hysteresis in an increasing/decreasing direction of the application voltage. However, the hysteresis stays at 10 mV or below in the case of the film having fluorine introduced therein. Furthermore, in the capacitor before introduction of fluorine, a phenomenon of discharging stored electric charges is intensive, and the electric charges were lost within several hours. However, introduction of fluorine allowed lost of the stored electric charges to be kept at approximately several % even after several days.

The above-explained effect of improving film characteristics demonstrates the fact that an oxygen vacancy is eliminated by fluorine, and that there is no reduction in the band gap or no level in the gap. According to the present invention, it was revealed that characteristics and reliability of the gate insulating film or the capacitor dielectric film are greatly improved.

Fourth Embodiment

Figure 17:
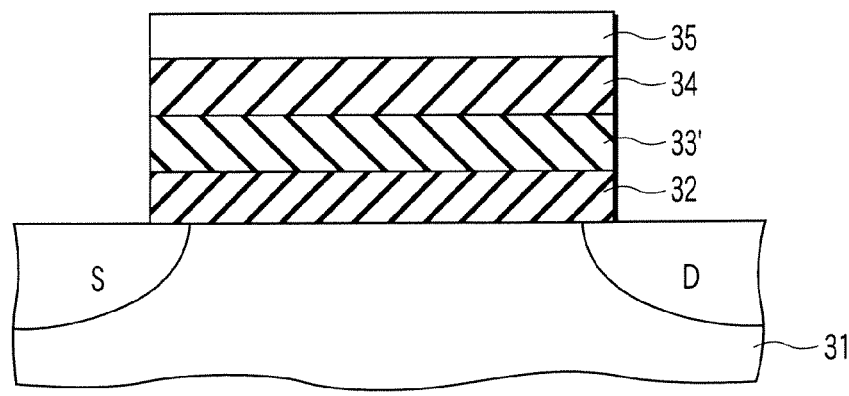
FIG. 17 is a cross-sectional view of a memory cell transistor according to a fourth embodiment.

A charge trapping type memory cell transistor can be provided by changing the layer 33 in the memory cell transistor according to the second embodiment to an electric charge accumulation insulating film (e.g., a silicon nitride film 33') (FIG. 17). Other structures and manufacturing methods are the same as those in the third embodiment, thereby omitting a tautological explanation.

In the case where oxygen vacancies are formed in the charge accumulation layer, there is a high possibility that charges are filled in the vacancies, thereby destroying the charge accumulation layer. However, addition of fluorine reduces the oxygen vacancies with result that the destruction is avoided. Thus, breakdown characteristics of the layer are increased.

In an insulating film according to the embodiment of the present invention, a metal oxide is used as a core material, and introducing fluorine allows a large reduction in the number of movable oxygen vacancies in the insulating film. However, when introducing fluorine, an appropriate amount of nitrogen or a metal additive having a valence lower than that of the core metal in the insulating film must be introduced.

This embodiment is characterized in that the number of oxygen vacancies in the oxide is increased by adding N or a low-valence material, e.g., Al, La, Y, Ba, Sr, Ca, or Mg and the oxygen vacancies are strongly fixed by fluorine to eliminate mobility. In many high-K dielectric oxides, an oxygen vacancy induces various deteriorations. However, introducing an appropriate amount of fluorine can avoid deterioration in a film caused due to oxygen vacancies. However, introduction of fluorine alone adversely induces charge centers and so forth. Therefore, simultaneously introducing appropriate amounts of fluorine and another additive enables solving problems that occur when one of these materials alone is introduced.

As a result, the following effects are demonstrated. (1) An amorphous structure can be maintained even at a high temperature; (2) no bandgap narrowing occurs and no level in the band gap is produced to thereby greatly improve the leakage current; (3) an oxygen vacancy is eliminated and fluorine enters and is fixed at a lattice point, thus considerably improving long-term reliability; (4) the entire system is stabilized by charge compensation and hence an internally fixed charge or fixed polarization does not occur; (5) an addition material that forms an ionic conductor in a conventional example can be used for a high-performance insulating film when an appropriate amount of fluorine is introduced; (6) an addition material having a concern of phase separation in a conventional example can be used for a high-performance insulating film when an appropriate amount of fluorine is introduced; (7) a band offset ΔEv of a valence band between a silicon substrate and an insulating film can be improved; and (8) a shift of a threshold value due to Fermi level pinning inherent to a PMOS can be solved.

As explained above, according to the present invention, vacancies such as oxygen vacancies or a leakage current can be reduced, and an insulating film having excellent reliability and a semiconductor device using this film can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An insulating film comprising a composition comprising:
   a first metal element as a core metal of the composition;
   oxygen of 33.3 atomic % or above;
   fluorine of 33.4 atomic % or below; and
   one element which is either a second metal element or nitrogen,
   wherein an amount of the fluorine is expressed as [F] in atomic %, an amount of the one element is expressed as [X] in atomic %, and a valence number difference between the first metal element and the second metal element or between oxygen and nitrogen is expressed as k (absolute number),
   when the one element is the second metal element, the first metal element is a quadrivalent metal element comprising one of Hf, Zr and Ti, and the second metal element is a trivalent metal element comprising one of La, Al, Sc, Y, Ce, Pr, Nd, Pm, Sm, Eu, Gd, Tb, Dy, Ho, Er, Tm, Yb and Lu, an amount of which is expressed as [trivalent element] in atomic %, then [X]=[trivalent element] and k=1,
   when the one element is the second metal element, the first metal element is the quadrivalent metal element, and the second metal element is a divalent metal element comprising one of Mg, Sr, Ba, and Ca, an amount of which is expressed as [divalent element] in atomic %, then [X]=[divalent element] and k=2,
   when the one element is the second metal element, the first metal element is the trivalent metal element, and the second metal element is the divalent metal element, an amount of which is expressed as [divalent element] in atomic %, then [X]=[divalent element] and k=1,
   when the one element is nitrogen, an amount of which is expressed as [N] in atomic %, then [X]=[N] and k=1, and
   the amounts of [X] and [F] in the insulating film satisfy a relationship of $\{k*[X]-[F]\}/2 \leq 8.4$ atomic % and a concentration distribution shape of k*[X] substantially matches the concentration distribution shape of [F].

2. The insulating film according to claim 1,
   wherein the one element is nitrogen, k=1 and a relationship of k*[X]=1*[N] is satisfied, and
   the amount of nitrogen is equal to or above the amount of fluorine, an atom of the first metal element is present to be adjacent to an atom of the fluorine in a lattice, and an atom of the nitrogen is present to be adjacent to an atom of the first metal element in the lattice.

3. The insulating film according to claim 1,
   wherein the one element is the second metal element, the first metal element is a quadrivalent metal element, the second metal element is a trivalent metal element, k=1 and a relationship of k*[X]=1*[trivalent element] is satisfied, and an amount of the trivalent metal element is equal to or above the amount of fluorine, and the trivalent metal element is present to be adjacent to the fluorine.

4. The insulating film according to claim 1, wherein the one element is the second metal element, the first metal element is a quadrivalent metal element, the second metal element is a divalent metal element, k=2 and a relationship of k*[X]=2*[divalent element] is satisfied, and a 2*[divalent element] amount that is double the amount of the divalent metal element is equal to or above the amount of fluorine, and an atom of the divalent metal element is present to be adjacent to an atom of the fluorine in a lattice.

5. The insulating film according to claim 1, wherein the one element is the second metal element, the first metal element is a trivalent metal element, the second metal element is a divalent metal element, k=1 and a relationship of k*[X]=1*[divalent element] is satisfied, and the amount of the divalent metal is equal to or above the amount of fluorine, and an atom of the divalent metal element is present to be adjacent to an atom of the fluorine.

6. The insulating film according to claim 1, wherein the one element is the second metal element, the first metal element is a trivalent metal element, the second metal element is a divalent metal element, k=1 and a relationship of k*[X]=1*[divalent element] is satisfied, and the trivalent metal element comprises one metal element selected from the group consisting of La, Al, and Y, and the divalent metal element contains one metal element selected from the group consisting of Mg, Ca, Sr, and Ba.

7. A semiconductor device comprising:

a semiconductor layer;

an insulating layer provided on the semiconductor layer, the insulating layer having an insulating film comprising a composition which comprises:
 a first metal element as a core metal of the composition;
 oxygen of 33.3 atomic % or above;
 fluorine of 33.4 atomic % or below; and
 one element which is either a second metal element or nitrogen, wherein an amount of the fluorine is expressed as [F] in atomic %, an amount of the one element is expressed as [X] in atomic %, and a valence number difference between the first metal element and the second metal element or between oxygen and nitrogen is expressed as k (absolute number), when the one element is the second metal element, the first metal element is a quadrivalent metal element comprising one of Hf, Zr and Ti, and the second metal element is a trivalent metal element comprising one of La, Al, Sc, Y, Ce, Pr, Nd, Pm, Sm, Eu, Gd, Tb, Dy, Ho, Er, Tm, Yb and Lu, an amount of which is expressed as [trivalent element], then [X]=[trivalent element] and k=1, when the one element is the second metal element, the first metal element is a quadrivalent metal element, and the second metal element is a divalent metal element comprising one of Mg, Sr, Ba, and Ca, an amount of which is expressed as [divalent element], then [X]=[divalent element] and k=2, when the one element is the second metal element, the first metal element is a trivalent metal element, and the second metal element is a divalent metal element, an amount of which is expressed as [divalent element], then [X]=[divalent element] and k=1, and when the one element is nitrogen, an amount of which is expressed as [N], then [X]=[N] and k=1;

the amounts of [X] and [F] in the insulating film satisfy a relationship of $\{k*[X]-[F]\}/2 \leq 8.4$ atomic % and a concentration distribution shape of k*[X] substantially matches the concentration distribution shape of [F] in the insulating film;

a gate electrode provided on the insulating layer; and source/drain regions that sandwich a region below the gate insulating layer on the semiconductor layer surface.

8. The device according to claim 7, wherein the one element is nitrogen and the first metal element is the quadrivalent metal element.

9. The device according to claim 8, wherein the amount of the nitrogen is equal to or above the amount of the fluorine, and an atom of the nitrogen is present to be adjacent to an atom of the fluorine in a lattice.

10. The device according to claim 7, wherein the fluorine is introduced in an interface between semiconductor layer and the insulating film on a side of the semiconductor layer, and a surface density of the fluorine in the interface is not lower than $2.5*10^{12}/cm^2$ and not greater than $1*10^{14}/cm^2$.

* * * * *